United States Patent
Detwiler et al.

(10) Patent No.: US 10,366,180 B2
(45) Date of Patent: *Jul. 30, 2019

(54) COMPUTER-IMPLEMENTED LAND PLANNING SYSTEM AND METHOD WITH AUTOMATED PARKING AREA DESIGN TOOLS

(75) Inventors: Michael W. Detwiler, Cornelius, NC (US); James W. Reynolds, Jr., Statesville, NC (US); Anthony H. Watts, Winston-Salem, NC (US); Thomas Baeck, Bochum (DE); Ron Breukelaar, Charlotte, NC (US); Hans Peter Senft, Charlotte, NC (US)

(73) Assignee: Bentley Systems, Inc., Exton, PA (US)

(*) Notice: Subject to any disclaimer, the term of this patent is extended or adjusted under 35 U.S.C. 154(b) by 1201 days.

This patent is subject to a terminal disclaimer.

(21) Appl. No.: 13/317,864

(22) Filed: Oct. 31, 2011

(65) Prior Publication Data
US 2012/0330621 A1     Dec. 27, 2012

Related U.S. Application Data

(63) Continuation-in-part of application No. 12/223,295, filed on Mar. 15, 2010, now Pat. No. 8,321,181.

(60) Provisional application No. 61/456,064, filed on Oct. 29, 2010, provisional application No. 61/456,005, filed on Oct. 29, 2010, provisional application No. 61/455,997, filed on Oct. 29, 2010.

(51) Int. Cl.
*G06F 17/50* (2006.01)

(52) U.S. Cl.
CPC .............................. *G06F 17/5004* (2013.01)

(58) Field of Classification Search
CPC .. G06F 17/5004; G06Q 10/04; G06Q 50/165; G06Q 50/08
See application file for complete search history.

(56) References Cited

U.S. PATENT DOCUMENTS

| 4,964,060 A | 10/1990 | Hartsog |
| 5,689,705 A | 11/1997 | Fino et al. |

(Continued)

OTHER PUBLICATIONS

Transoft, ParkCAD, 2007, 4 pages.*

(Continued)

*Primary Examiner* — Suzanne Lo
(74) *Attorney, Agent, or Firm* — Schwartz Law Firm, P.C.

(57) ABSTRACT

A computer-implemented land planning system is designed to generate at least one conceptual fit solution to a user-defined land development problem. The system employs a computer readable medium and a computer program encoded on the medium. The computer program is operable, when executed on a computer, for electronically creating at least one candidate solution to the land development problem. The candidate solution incorporates engineering measurements applicable in development of an undeveloped land site, the land site including a conceptually designed vehicle parking area. A fitness function quantitatively evaluates the candidate solution based on its cost. A heuristic problem-solving strategy manipulates the engineering measurements of the candidate solution to achieve a more quantitatively fit solution to the land development problem. Documentation illustrating the fit solution to the land development problem is delivered to the user.

12 Claims, 30 Drawing Sheets

(56) References Cited

U.S. PATENT DOCUMENTS

| | | | |
|---|---|---|---|
| 5,740,341 A | 4/1998 | Oota et al. | |
| 5,761,674 A | 6/1998 | Ito | |
| 5,867,397 A | 2/1999 | Koza et al. | |
| 5,918,219 A | 6/1999 | Isherwood | |
| 6,037,945 A | 3/2000 | Loveland | |
| 6,392,651 B1 | 5/2002 | Stradley | |
| 6,411,945 B1 | 6/2002 | Nakajima | |
| 6,532,453 B1 | 3/2003 | Koza et al. | |
| 6,757,667 B1 | 6/2004 | Patel | |
| 7,395,191 B2 * | 7/2008 | Detwiler et al. | 703/1 |
| 8,260,585 B2 * | 9/2012 | Detwiler et al. | 703/1 |
| 8,321,181 B2 * | 11/2012 | Detwiler et al. | 703/1 |
| 2001/0047251 A1 | 11/2001 | Kemp | |
| 2002/0010572 A1 | 1/2002 | Orton et al. | |
| 2003/0023412 A1 | 1/2003 | Rappaport et al. | |
| 2003/0036889 A1 | 2/2003 | Goodman et al. | |
| 2003/0061012 A1 | 3/2003 | Orr et al. | |
| 2004/0117777 A1 | 6/2004 | Llohana | |
| 2004/0260573 A1 | 12/2004 | Schmitt | |
| 2005/0078110 A1 | 4/2005 | Lewis et al. | |
| 2005/0086096 A1 | 4/2005 | Bryant | |
| 2005/0268245 A1 | 12/2005 | Gipps | |
| 2006/0020430 A1 | 1/2006 | Gipps | |
| 2006/0020431 A1 | 1/2006 | Gipps | |
| 2006/0020789 A1 | 1/2006 | Gipps | |
| 2006/0206623 A1 | 9/2006 | Gipps | |
| 2007/0061274 A1 | 3/2007 | Gipps | |
| 2008/0215390 A1 | 9/2008 | Gipps | |
| 2008/0262988 A1 | 10/2008 | Williams et al. | |
| 2009/0094077 A1 | 4/2009 | Gipps | |
| 2009/0198505 A1 | 8/2009 | Gipps | |
| 2010/0223276 A1 | 9/2010 | Al-Shameri et al. | |

OTHER PUBLICATIONS

Chew et al. "Simultaneous Optimization of Horizontal and Vertical Alignments for Highways" 1989, Transpn, Res. B, vol. 23B, No. 5, pp. 315-329.*

Osman et al. "A hybrid CAD-based construction site layout palnning system using genetic algorithms", 2003, Automation in Construction 12, pp. 794-764.*

Moreb, Ahmad "Linear programming model for finding optimal roadway grades that minimize earthwork cost", 1996, European Journal of Operational Research, 93, pp. 148-154.*

Rocky Mountain Region Forest Service, "CAD Standards User's Guide", May 2005, Version 3.0, 116 pages.*

Schoenstein, Michael, "AutoCAD Land Development Desktop Release 2I", Digital Earth Moving: First International Symposium, DEM 2001, Sep. 5-7, 2001 Proceedings, 6 pages.

Autodesk, Inc. "Greater Cincinnati Water Agency Flows Freely with Land Development Desktop", Nov. 22, 2004, 4 pages.

Autodesk, Inc. "AutoCAD Land Development Desktop Getting Started Guide", 1999, 285 pages.

Bentley System, Incoporated. "Geopak Site", Updated Aug. 1, 2005, 9 pages.

Cook et al. "Virtual reality for large-scale industrial applications", Future Generation Computer Systems 14, 1998, pp. 157-166.

B. Chandrasekaran, "Review of Intelligent Systems for Engineering: A Knowledge-Based Approach", American Assoc. for Artificial Intelligence, Winter 2000 Book review, p. 123-24.

David C. Brown, "Review of 1993 Article on Intelligent Computer-Aided Design" Encyclopedia of Computer Science and Technology, Sep. 1998, pp. 2-45.

Dr. M. Farhl, Dr. A. Ghassan & Dr. C. Grahame., Editor C. Eastman, "Osconcad: A Model-Based Cad System Integrated with Computer Applications", Itcon.org, Dec. 1998, p. 27-45.

Dan Loughlin & Gary Goldstein, "Exploring Near-Equilibrium Solutions: The MARKAL-MGA Algorithm and Use", ETSAP 2004 Spring Mtg, Paris France, Jun. 21, 2004, pp. 1-8.

"Genetic Algorithms and Evolutionary Computation", What is a genetic algorithm?, www.talkorgins.org/faqs/genalg.html, pp. 1-11, published prior to Jun. 23, 2005.

Thomas E. Delaney, The Genetic Model in Business Application Development, Artificial Intelligence in Business Series, Delaney Software Services Inc. Jun. 23, 2006 pp. 1-18.

"AutoCAD Land Development Desktop Release 2", CRC Civil Engineering Solution Tour, pp. 1-2, www.cadresource.com/tour/civil.htmo, last updated Mar. 14, 2001.

Bouchlaghem, N.M., and Liyanage, I.G. (1996) Virtual Reality applications in the UK's Construction Industry, Construction on the Information Highway, CIB W78 Worklng Commission on Information Technology in Construction, Bled (Slovenia), Turk, Z. (Ed), University of Ljublajana.

Matthew, K.B. et al: "Implementation of a spatial decision support system for rural land use planning: integrating geographic information system and environmental models with search and optimisation algorithms"; Computers and Electronics in Agriculture—Elsevier Netherlands, vol. 23, No. 1, Jun. 1999, pp. 9-26.

Ohsaki, Yorihiko et al: "Computer-Aided Engineering in the Construction Industry" Eng. Comput (New York) 1985, vol. 1, No. 2, 1985, pp. 87-102.

Ribeiro Fliho, J.L. et al.: "Genetic-Algorithm Programming Environments" Computer IEEE Service Center, Los Alamitos, CA, US, vol. 27, No. 6; Jun. 1, 1994; pp. 28-43.

Gipps, Peter et al., "New Technologies for Transport Route Selection", Transportation Research, Part C 9 (2001) pp. 135-154.

Easa, Said M., "Selection of Roadway Grades That Minimize Earthwork Cost Using Linear Programming"; in revised form Aug. 18, 1987; Trans. Res.-A; vol. 22A No. 2; pp. 121-136; 1988.

Moreb, Ahmad A., "Theory and Methodology, Linear Programming Model for Finding Optimal Roadway Grades That Minimize Earthwork Cost"; European Journal of Operational Research 93 (1996) 148-154; Mar. 1995.

Chew, E.P. et al., "Simultaneous Optimization of Horizontal and Vertical Alignments for Highways"; Revised May 31, 1988; Transpn. Res.-B.; vol. 23B No. 5; pp. 315-329; 1989.

Koch, Valentin Raphael, "Optimizing Earthwork Block Removal in Road Construction"; Master of Science in the College of Graduate Studies; The University of British Columbia; Apr. 2010; pp. 1-86.

A policy on geometric design of highways and streets: 2001. American Association of State Highway and Transportation Officials, pp. 235-282, 2001.

Deryl Burch. Estimating Excavation. Craftsman Book Company, 1st edition, pp. 82-83, 1997.

J Jong and P Schonfeld; An evolutionary model for simultaneously optimizing three-dimensional highway alignments. Transportation Research Part B: Methodological, 37(2); pp. 107-128; Feb. 2003.

John Kleinberg and Eva Tardos. Algorithm Design. Pearson Eduction, Inc., 1st edition; pp. 261-266, 2006.

Osman et al. "A hybrid CAD-based construction site layout planning system using genetic algorithms", 2003, Automation in Construction 12, pp. 749-764.

* cited by examiner

| Description | On Site | Quantity | Unit | Unit Cost | Subtotal | Total |
|---|---|---|---|---|---|---|
| ON-SITE PREPARATION | | | | | | |
| Site Clearing | | | | | | |
| Clearing | | 8.67 | AC | $5,600.00 | $48,552.00 | |
| Topsoil Strip/Cut | | 7,050.86 | CY | $1.50 | $10,576.29 | |
| Topsoil Fill | | 3,433.33 | CY | $1.50 | $5,150.00 | |
| Topsoil Export | | 3,617.53 | CY | $8.00 | $28,940.24 | |
| Total Site Clearing | | | | | $93,218.53 | $93,218.53 |
| Grading Cut | | | | | | |
| Earth Cut | | 49,054.33 | CY | $1.75 | $85,845.08 | |
| Rock Cut | | 0.00 | CY | $11.00 | $0.00 | |
| Unsuitable Cut | | 0.00 | CY | $3.50 | $0.00 | |
| Pipe Earth Cut | | 1,514.46 | CY | $16.00 | $24,231.36 | |
| Pipe Rock Cut | | 0.00 | CY | $11.00 | $0.00 | |
| Total Grading Cut | | 50,568.79 | CY | | $110,076.44 | $110,076.44 |
| Grading Fill | | | | | | |
| Earth Fill | | 49,054.33 | CY | $1.75 | $85,845.08 | |
| Import/Borrow Fill | | 9,458.09 | CY | $16.00 | $151,329.44 | |
| Desired Import | | 0.00 | CY | $0.00 | $0.00 | |
| Pipe Earth Fill | | 1,360.70 | CY | $16.00 | $21,771.20 | |
| Pipe Earth Import | | 0.00 | CY | $16.00 | $0.00 | |
| Total Grading Fill | | 59,873.12 | CY | | $258,945.72 | $258,945.72 |
| Grading Export | | | | | | |
| Earth Export | | 0.00 | CY | $8.00 | $0.00 | |
| Rock Export | | 0.00 | CY | $8.00 | $0.00 | |
| Unsuitable Export | | 0.00 | CY | $8.00 | $0.00 | |
| Desired Earth Export | | 0.00 | CY | $0.00 | $0.00 | |
| Pipe Earth Export | | 153.75 | CY | $8.00 | $1,230.00 | |
| Pipe Rock Export | | 0.00 | CY | $8.00 | $0.00 | |
| Total Grading Export | | 153.75 | CY | | $1,230.00 | $1,230.00 |
| Retaining Wall | | 2,085.98 | SF | $25.00 | | $52,149.50 |
| Other Preparation | | | | | | |
| Fine Grading (Building) | | 5,000.00 | SY | $1.00 | $5,000.00 | |
| Fine Grading (Non-Building) | | 16,709.45 | SY | $1.00 | $16,709.45 | |
| Erosion Control | | 0.00 | AC | $2,500.00 | $0.00 | |
| Seeding | | 4.16 | AC | $1,600.00 | $6,688.00 | |
| Total Other Preparation | | | | | $28,397.45 | $28,397.45 |
| | | | | | Total | $544,017.64 |
| ON-SITE IMPROVEMENTS | | | | | | |
| Paving - Asphalt | | | | | | |
| Asphalt Paving - Drives (Light Duty) | | 15,187.26 | SY | $13.94 | $211,710.40 | |
| Asphalt Paving - Drives (Heavy Duty) | | 1,013.46 | SY | $15.45 | $15,657.96 | |
| Asphalt Paving - Streets (Light Duty) | | 0.00 | SY | $13.94 | $0.00 | |
| Asphalt Paving - Streets (Heavy Duty) | | 0.00 | SY | $15.45 | $0.00 | |
| Total Paving Asphalt | | 16,200.72 | SY | | $227,368.36 | $227,368.36 |
| Paving - Concrete | | | | | | |
| Concrete Paving - Drives (Light Duty) | | 0.00 | SY | $16.20 | $0.00 | |
| Concrete Paving - Drives (Heavy Duty) | | 0.00 | SY | $18.05 | $0.00 | |
| Concrete Paving - Streets (Light Duty) | | 0.00 | SY | $16.20 | $0.00 | |
| Concrete Paving - Streets (Heavy Duty) | | 0.00 | SY | $18.05 | $0.00 | |
| Total Paving Concrete | | 0.00 | SY | | $0.00 | $0.00 |
| Paving - Pedestrian | | | | | | |
| Pedestrian Asphalt | | 0.00 | SY | $35.00 | $0.00 | |
| Pedestrian Concrete | | 508.73 | SY | $35.00 | $17,805.55 | |
| Total Paving Pedestrian | | 508.73 | SY | | $17,805.55 | $17,805.55 |
| Paving - Other | | | | | | |
| Paving - Alternative 1 | | 0.00 | SY | $16.00 | $0.00 | |
| Paving - Alternative 2 | | 0.00 | SY | $16.00 | $0.00 | |
| Paving - Alternative 3 | | 0.00 | SY | $16.00 | $0.00 | |
| Paving - Gravel | | 0.00 | SY | $10.00 | $0.00 | |
| Total Paving Other | | 0.00 | SY | | $0.00 | $0.00 |
| Curb & Gutter | | | | | | |
| Street Curb & Gutter | | 0.00 | LF | $18.00 | $0.00 | |
| Drive Curb & Gutter | | 991.02 | LF | $18.00 | $17,838.36 | |
| Parking Curb & Gutter | | 4,531.92 | LF | $15.00 | $67,978.80 | |
| Total Curb & Gutter | | 5,522.94 | LF | | $85,817.16 | $85,817.16 |
| | | | | | Total | $330,991.07 |

Fig. 47A

| ON-SITE STORM WATER DRAINAGE | | | | | |
|---|---|---|---|---|---|
| Storm Water FES | | | | | |
| 12.0" FES | 0.00 | EA | $800.00 | $0.00 | |
| 15.0" FES | 0.00 | EA | $900.00 | $0.00 | |
| 18.0" FES | 0.00 | EA | $1,000.00 | $0.00 | |
| 24.0" FES | 0.00 | EA | $1,200.00 | $0.00 | |
| 30.0" FES | 1.00 | EA | $1,500.00 | $1,500.00 | |
| 36.0" FES | 0.00 | EA | $1,800.00 | $0.00 | |
| 42.0" FES | 0.00 | EA | $2,100.00 | $0.00 | |
| 48.0" FES | 0.00 | EA | $2,400.00 | $0.00 | |
| 54.0" FES | 0.00 | EA | $2,700.00 | $0.00 | |
| 60.0" FES | 0.00 | EA | $3,000.00 | $0.00 | |
| Total Storm Water FES | | | | $1,500.00 | $1,500.00 |
| Storm Water Pipes | | | | | |
| 10.0" Pipe | 199.00 | LF | $15.00 | $2,985.00 | |
| 12.0" Pipe | 25.00 | LF | $18.00 | $450.00 | |
| 15.0" Pipe | 512.00 | LF | $22.00 | $11,264.00 | |
| 18.0" Pipe | 47.00 | LF | $25.00 | $1,175.00 | |
| 24.0" Pipe | 471.00 | LF | $30.00 | $14,130.00 | |
| 30.0" Pipe | 142.00 | LF | $38.00 | $5,396.00 | |
| 36.0" Pipe | 0.00 | LF | $52.00 | $0.00 | |
| 42.0" Pipe | 0.00 | LF | $60.00 | $0.00 | |
| 48.0" Pipe | 0.00 | LF | $65.00 | $0.00 | |
| 54.0" Pipe | 0.00 | LF | $70.00 | $0.00 | |
| 60.0" Pipe | 0.00 | LF | $75.00 | $0.00 | |
| Total RCP Pipes | | | | $35,400.00 | $35,400.00 |
| Inlets | 8.00 | EA | $1,750.00 | | $14,000.00 |
| Inlets (Oversized) | 0.00 | EA | $3,000.00 | | $0.00 |
| Inlets LF | 46.72 | LF | $200.00 | | $9,344.00 |
| Inlets LF (Oversized) | 0.00 | LF | $350.00 | | $0.00 |
| Manholes | 0.00 | EA | $2,000.00 | | $0.00 |
| Manholes (Oversized) | 0.00 | EA | $3,500.00 | | $0.00 |
| Manholes LF | 0.00 | LF | $200.00 | | $0.00 |
| Manholes LF (Oversized) | 0.00 | LF | $350.00 | | $0.00 |
| Storm Mains | 0.00 | EA | $2,750.00 | | $0.00 |
| Rip Raps | 1.00 | EA | $2,500.00 | | $2,500.00 |
| Pond Kits | 0.00 | EA | $17,500.00 | | $0.00 |
| Pumps | 0.00 | EA | $10,000.00 | | $0.00 |
| | | | | Total | $62,744.00 |
| | | | | Total Cost Estimate For Site | $937,752.71 |

Fig. 47B

COMPUTER-IMPLEMENTED LAND PLANNING SYSTEM AND METHOD WITH AUTOMATED PARKING AREA DESIGN TOOLS

TECHNICAL FIELD AND BACKGROUND OF THE DISCLOSURE

This disclosure relates broadly and generally to a computer-implemented land planning System and Method, such as that designed to generate one or more conceptual fit solutions to a user-defined land development problem. In exemplary embodiments described herein, the "problem" is expressed in terms of optimizing land development based on costs and budget constraints. Alternatively, the present disclosure may focus on other economic considerations such as return on investment (ROI). One example described below relates to the planning and development of a single pad commercial site. The present concept, however, is equally applicable to the planning and development of multi-pad commercial, mixed use, and residential sites, communications easements, roadways and railways, parking areas, and the like.

The land development process commonly employed today by professional real estate developers, corporations, government entities and others to assess land for engineering feasibility, cost of developing, and investment purposes is time consuming, inaccurate, and expensive. Unfortunately, the current process is getting even more complex and expensive due to added bureaucratic complications with land use zoning, environmental protection requirements, extended permitting processes, as well as the availability and escalating cost of land in desirable areas. This problem affects a broad spectrum of land users including, for example, real estate developers (office/industrial, commercial, retail, residential), corporations which own and use real estate (public/private), government entities (Federal, State, County, City).

For each of the above users, assessing the feasibility of a land site for development typically involves a land development team including one or more architects, engineers, and land planners. Many of these team members are engaged to layout and plan the intended uses on the site being considered. This initial planning process can take from 2 days to four weeks, and usually results in a single schematic drawing with limited information (e.g., will the site support the building footprints or building lots and the necessary streets and/or parking lots?). At this point, based largely on intuition and a "gut feeling" about the project, the developer will choose to contract for additional planning and engineering to more accurately assess the feasibility of the plan and the budget. This process can take 2 weeks to 16 weeks and usually results in only one option that is based on the designer's experience but is not optimized in any respect. This information is then used to estimate a more accurate budget. Often times value engineering is required to bring the design back within the original budget. This process takes 2 weeks to 6 weeks. The final budget is not generally determined until the end of the planning process—some 3-4 months after initial consideration of the land site.

The above planning process often must occur before the property is purchased, and requires substantial investment in legal fees and earnest money to hold the property for an extended length of time.

After this 4 week to 28-week process (average 16 weeks) and considerable expense and risk of lost opportunity, the developer must assess the risk of purchasing and developing the property based on one un-optimized design option. Unfortunately, the process outlined above is complicated even further by miscommunication and disconnect between the many groups involved, which often results in bad designs, bad budgets, disagreements, and bad projects.

The present applicant recognized that the land development industry needs a major paradigm shift, which is now possible through advances in mathematical modeling and computing hardware. One primary goal of the present disclosure is to fix the problems outlined above through a virtual engineering system that can produce many optimized alternatives for land development—including the planning, engineering, and budgeting of each potential solution. In exemplary implementations, this computing process may be achieved in a short period—often within a matter of hours.

SUMMARY OF EXEMPLARY EMBODIMENTS

Various exemplary embodiments of the present invention are described below. Use of the term "exemplary" means illustrative or by way of example only, and any reference herein to "the invention" is not intended to restrict or limit the invention to exact features or steps of any one or more of the exemplary embodiments disclosed in the present specification. References to "exemplary embodiment," "one embodiment," "an embodiment," "various embodiments," and the like, may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

It is also noted that terms like "preferably", "commonly", and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

The exemplary System and Method may be implemented via a computer program product (e.g., software application) comprising program instructions tangibly stored on a computer-readable medium, and operable to cause a computing device to perform optimized land planning. The present disclosure further comprises a computer-readable storage medium storing computer-executable instructions, executable by processing logic of a computing device, including one or more instructions, that when executed by the processing logic, cause the processing logic to perform optimized land planning. In yet another exemplary embodiment, the present disclosure comprises an article of manufacture including a computer-readable storage medium, and executable program instructions embodied in the storage medium that when executed by processing logic of a computing device causes the processing logic to perform optimized land planning. The computing device may incorporate or comprise any general or specific purpose machine with processing logic capable of manipulating data according to a set of program instructions. Examples of computing devices include a personal computer, laptop, netbook, tablet computer, and others.

Therefore, it is an object of the disclosure to provide a computer-implemented land planning System and Method which in one exemplary implementation may automatically generate at least one conceptual fit solution to a user-defined land development problem.

It is another object of the disclosure to provide a computer-implemented land planning System which in one exemplary implementation may utilize a heuristic problem solving-strategy, such as evolutionary algorithms. According to one evolutionary algorithm, the evolution starts from a population of completely random individuals and happens in generations. In each generation, the fitness of the whole population is evaluated, multiple individuals are stochastically or deterministically selected from the current population (based on their fitness), modified (mutated and/or recombined) to form a new population, which either in total or in part becomes current in the next iteration of the algorithm. During this process, the size of the population can stay constant (like in a genetic algorithm) or change (like in a (m,l)- or (m+l)-evolution strategy).

It is another object of the disclosure to provide a computer-implemented land planning System which in one exemplary implementation may perform land planning and engineering simultaneously. This disclosure may consider various land development parameters (e.g., site specifications, user constraints, cost information) up front from both the land planner and the engineer perspective, and then explores thousands of options using heuristic algorithms to determine which options are best as determined by cost and/or revenue.

It is another object of the disclosure to provide a computer-implemented land planning System which in one exemplary implementation may apply a heuristic problem-solving strategy to the current civil engineering process to revolutionize residential and commercial land planning and development.

It is another object of the disclosure to provide a computer-implemented land planning System which in one exemplary implementation may shorten the time it takes to get a final engineering drawing (85% complete or more), including cost information, from 3-4 months to less than 24 hours in many cases.

It is another object of the disclosure to provide a computer-implemented land planning System which in one exemplary implementation may provide technology, accessible via the web, which will enable a user to determine the most cost-effective way to develop a land site.

It is another object of the disclosure to provide a computer-implemented land planning System which in one exemplary implementation may enable visualization of a land development problem and the ultimate solution.

It is another object of the disclosure to provide a computer-implemented land planning System which in one exemplary implementation may give the land developer direct access to qualified information in roughly 24 hours (or less) versus many months.

It is another object of the disclosure to provide a computer-implemented land planning System which in one exemplary implementation may minimize the initial investment capital required for developing a land site.

It is another object of the disclosure to provide a computer-implemented land planning System which in one exemplary implementation may lower engineering costs.

It is another object of the disclosure to provide a computer-implemented land planning System which in one exemplary implementation may minimize the risk associated with developing a land site.

It is another object of the disclosure to provide a computer-implemented land planning System which in one exemplary implementation may minimize engineering time.

It is another object of the disclosure to provide a computer-implemented land planning System which in one exemplary implementation may effectively integrate the creative (aesthetics) and engineering sides of land planning and development to achieve a very good or even globally optimal solution.

It is another object of the disclosure to provide a computer-implemented land planning System which in one exemplary implementation may optimize around financial measurements, such as cost and/or return on investment (ROI).

It is another object of the disclosure to provide a computer-implemented land planning System which in one exemplary implementation may generate multiple "optimally different" solutions to a land development problem, and which presents the solutions in a ".dwg" format that can be input and manipulated directly into an engineers' existing CAD/CAM system.

It is another object of the disclosure to provide a computer-implemented land planning System which in one exemplary implementation is available for use on stand-alone PCs or networks.

It is another object of the disclosure to provide a computer-implemented land planning System which in one exemplary implementation may utilize Digital Satellite Topography.

It is another object of the disclosure to provide a computer-implemented land planning System which in one exemplary implementation may utilize a heuristic problem-solving strategy capable of manipulating many parameters simultaneously.

It is another object of the disclosure to provide a computer-implemented land planning System which in one exemplary implementation may utilize a heuristic problem-solving strategy which searches beyond the local optima.

It is another object of the disclosure to provide a computer-implemented land planning System which in one exemplary implementation may utilize a heuristic problem-solving strategy designed to be able to find the global optimum in a space with many local optima—a property called global convergence with probability one.

It is another object of the disclosure to provide a computer-implemented land planning System which in one exemplary implementation may utilize a heuristic problem-solving strategy applicable in traffic engineering including signal optimization and highway design.

It is another object of the disclosure to provide a computer-implemented land planning System which in one exemplary implementation may utilize a heuristic problem-solving strategy applicable for optimizing the structural design of buildings and bridges.

These and other objects of the present disclosure are achieved in the exemplary embodiments disclosed below by providing a computer-implemented land planning system (referred to herein as "System"), such as that designed to generate at least one conceptual fit solution to a user-defined land development problem. In one implementation, the System employs a computer readable medium and a computer program encoded on the medium. The computer program is operable, when executed on a computer, for electronically creating at least one candidate solution to the land development problem. The candidate solution incorporates a plurality of engineering measurements applicable in development of an undeveloped land site. A fitness function quantitatively evaluates the candidate solution based on its cost. The fitness function might also include one or more penalty components which account for the candidate solution violating one or more user defined constraints. A heuristic problem-solving strategy manipulates the engineering measurements of the candidate solution to achieve a more quantitatively fit solution to the land development problem. An output means, such as a display monitor, printer, electronic communication, or the like, delivers to a user documentation illustrating the fit solution to the land development problem.

The term "planning" is defined broadly herein to refer to any conceptual development of a land site.

The term "undeveloped land site" refers to a site which may or may not have existing structure and/or engineering infrastructure, and which is not yet developed according to one of the conceptual fit solutions generated in the present System.

The term "heuristic" refers broadly to any problem-solving strategy that utilizes adaptive, self-learning, or self-adaptive techniques (as the evaluation of feedback) to improve performance. The following are examples of heuristic problem-solving strategies: evolutionary algorithms (such as genetic algorithms, evolution strategies, evolutionary programming, genetic programming, and variants of these), simulated annealing, differential evolution, neural networks, hill climbing strategies, ant colony optimization, particle swarm optimization, and tabu search. For certain sub-tasks also linear programming, mixed-integer programming, and branch-and-bound algorithms are considered as heuristics.

In another embodiment, the disclosure is a computer-implemented land planning System designed to generate at least one conceptual fit solution to a user-defined land development problem. A processor accesses land development constraints for an undeveloped land site. The System further employs a computer readable medium and a computer program encoded on the medium. The computer program is operable, when executed on a computer, for conceptually designing a vehicle parking area within the undeveloped land site. The computer program further creates a population of candidate solutions to the land development problem. Each candidate solution includes a plurality of engineering measurements applicable in development of the undeveloped land site. The processor accesses a cost model including respective cost data for each of the engineering measurements. A computer program comprises instructions for penalizing (or even discarding) unfit solutions which violate the land development constraints. For all solutions which have not been discarded right away due to constraint violations, a fitness function is employed for calculating a fitness score based on the cost data for the engineering measurements. The fitness function uses various cost measures and also can use various penalty measures to calculate fitness of solution candidates.

A heuristic problem-solving strategy manipulates the engineering measurements of respective selected candidate solutions to achieve increased fitness scores, such that those candidate solutions achieving increased fitness scores are more likely to be used or are even deterministically selected to form a new population in the next iteration of the algorithm. A computer program comprises instructions for selecting a set of optimally different alternative solutions from the plurality of fit solutions. An output means, such as a display monitor, printer, electronic communication, or the like, is employed for delivering to a user documentation illustrating the optimally different alternative solutions to the land development problem.

According to another exemplary embodiment, the means (e.g., computer algorithm) for conceptually designing a vehicle parking area includes means for incorporating one or more custom islands within the parking area.

According to another exemplary embodiment, the means for conceptually designing a vehicle parking area includes means for illustrating one or more transition pathways within the parking area.

According to another exemplary embodiment, the means for conceptually designing a vehicle parking area includes means for creating parking spaces on arcs within the parking area.

According to another exemplary embodiment, the means for conceptually designing a vehicle parking area includes means for creating custom-sized parking spaces within the parking area.

According to another exemplary embodiment, the means for conceptually designing a vehicle parking area includes means for conceptually resizing a parking lot within the parking area, and wherein the parking area comprises a predetermined fixed number of parking spaces.

According to another exemplary embodiment, the means for conceptually designing a vehicle parking area includes means for locating multiple parking lots within the parking area.

According to another exemplary embodiment, the optimization engine comprises a plurality of engineering solvers selected from a group consisting of layout solver, grading solver, and utility solver. The layout solver calculates costs of engineering measurements for site layout. The grading solver calculates costs of engineering measurements for site grading. The utility solver calculates costs of engineering measurements for site utilities.

According to another exemplary embodiment, means are employed for utilizing each of the engineering solvers independent of the other solvers, such that costs of engineering measurements for site layout can be calculated independent of site grading and utilities, and costs of engineering measurements for site grading can be calculated independent of site layout and utilities, and costs of engineering measurements for site utilities can be calculated independent of site layout and grading.

According to another exemplary embodiment, means are employed for stacking at least two of the plurality of engineering solvers, such that engineering measurements for at least two of site layout, site grading, and site utilities are interdependent.

According to another exemplary embodiment, means are employed for digitally representing the undeveloped land site in three-dimensional space.

According to another exemplary embodiment, means are employed for digitally representing the engineering measurements within said three-dimensional space.

According to another exemplary embodiment, means are employed for electronically simulating storm water runoff for the undeveloped land site, and for digitally representing the simulated runoff on a computer display screen.

According to another exemplary embodiment, means are employed for electronically simulating site layout of a candidate solution, and for digitally representing the simulated layout on a computer display screen.

According to another exemplary embodiment, means are employed for electronically simulating site grading of a candidate solution, and for digitally representing the simulated grading on a computer display screen.

According to another exemplary embodiment, the documentation comprises a least one computer-generated drawing.

According to another exemplary embodiment, the documentation further comprises an itemized cost listing of said engineering measurements.

According to another exemplary embodiment, the documentation is delivered to the user via a global communications network.

According to another exemplary embodiment, the plurality of engineering measurements for site layout are selected from a group consisting of a paving surface measurement, curb length, and a sidewalk surface measurement.

According to another exemplary embodiment, the plurality of engineering measurements for site grading are selected from a group consisting of a measurement of disturbed area, a measurement of stripped topsoil, a measurement of earth cut, a measurement of rock cut, a measurement of unsuitable cut, a measurement of fill, a measurement of cut exported from site, a measurement of fill imported to site, and a wall surface measurement.

According to another exemplary embodiment, the plurality of engineering measurements for site utilities are selected from a group consisting of number of inlets, height of inlets, number of manholes, height of manholes, number of ripraps, number of pond kits, number of storm water main tie-ins, number of pumps, and amount of rock cut for pipes.

In yet another exemplary embodiment, the present disclosure comprises a computer-implemented land planning method (referred to herein as "Method") designed to generate at least one conceptual fit and cost-optimized solution to a user-defined land development problem. The Method conceptually designs a vehicle parking area within an undeveloped land site. At least one candidate solution to the land development problem is electronically generated. The candidate solution comprises a plurality of interrelated engineering measurements applicable in development of the undeveloped land site. The plurality of engineering measurements are selected from a group consisting of site layout, site grading, and site utilities. Cost data is acquired for (or associated with) the plurality of engineering measurements. The engineering measurements of the candidate solution are manipulated until at least one cost-optimized fit solution to the land development problem is achieved, such that a change relative to one of the plurality of engineering measurements for the candidate solution effects a change relative to another of the plurality of engineering measurements for that candidate solution. Documentation illustrating the cost-optimized fit solution to the land development problem is outputted to the user.

In yet another exemplary embodiment, the present disclosure comprises a computer program product including program instructions tangibly stored on a computer-readable medium and operable to cause a computing device to perform a land planning method designed to generate at least one conceptual fit and cost-optimized solution to a user-defined land development problem.

In yet another exemplary embodiment, the present disclosure comprises a computer-readable storage medium storing computer-executable instructions, executable by processing logic of a computing device, including one or more instructions, that when executed by the processing logic, cause the processing logic to perform a land planning method designed to generate at least one conceptual fit and cost-optimized solution to a user-defined land development problem.

In still another exemplary embodiment, the present disclosure comprises an article of manufacture comprising a computer-readable storage medium, and executable program instructions embodied in the storage medium that when executed by processing logic of a computing device causes the processing logic to perform a land planning method designed to generate at least one conceptual fit and cost-optimized solution to a user-defined land development problem.

BRIEF DESCRIPTION OF THE DRAWINGS

Exemplary embodiments of the present invention will hereinafter be described in conjunction with the following drawing figures, wherein like numerals denote like elements, and wherein:

FIGS. 47A and 47B illustrate exemplary cost reports.

DESCRIPTION OF EXEMPLARY EMBODIMENTS AND BEST MODE

Figure 1:
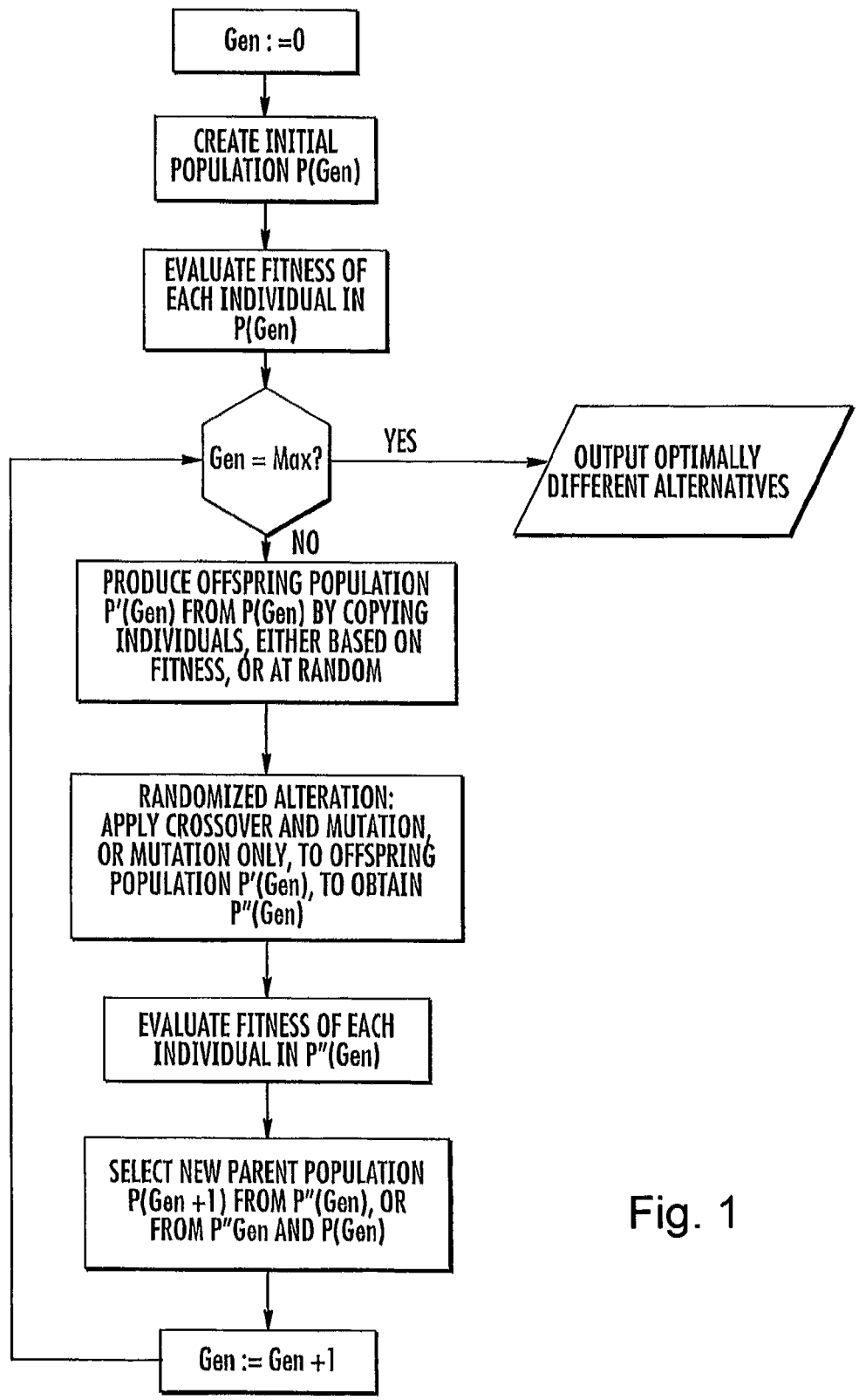
FIG. 1 illustrates use of an exemplary fitness function for quantitatively evaluating the fitness of candidate solutions.

The present invention is described more fully hereinafter with reference to the accompanying drawings, in which one or more exemplary embodiments of the invention are shown. This invention may, however, be embodied in many different forms and should not be construed as limited to the embodiments set forth herein; rather, these embodiments are provided so that this disclosure will be operative, enabling, and complete. Accordingly, the particular arrangements disclosed are meant to be illustrative only and not limiting as to the scope of the invention, which is to be given the full breadth of the appended claims and any and all equivalents thereof. Moreover, many embodiments, such as adaptations, variations, modifications, and equivalent arrangements, will be implicitly disclosed by the embodiments described herein and fall within the scope of the present invention.

Although specific terms are employed herein, they are used in a generic and descriptive sense only and not for purposes of limitation. Unless otherwise expressly defined herein, such terms are intended to be given their broad ordinary and customary meaning not inconsistent with that applicable in the relevant industry and without restriction to any specific embodiment hereinafter described. As used herein, the article "a" is intended to include one or more items. Where only one item is intended, the term "one", "single", or similar language is used. When used herein to join a list of items, the term "or" denotes at least one of the items, but does not exclude a plurality of items of the list.

For exemplary methods or processes of the invention, the sequence and/or arrangement of steps described herein are illustrative and not restrictive. Accordingly, it should be understood that, although steps of various processes or methods may be shown and described as being in a sequence or temporal arrangement, the steps of any such processes or methods are not limited to being carried out in any particular sequence or arrangement, absent an indication otherwise. Indeed, the steps in such processes or methods generally may be carried out in various different sequences and arrangements while still falling within the scope of the present invention.

Additionally, any references to advantages, benefits, unexpected results, or operability of the present invention are not intended as an affirmation that the invention has been previously reduced to practice or that any testing has been performed. Likewise, unless stated otherwise, use of verbs in the past tense (present perfect or preterit) is not intended to indicate or imply that the invention has been previously reduced to practice or that any testing has been performed.

In an exemplary implementation, the present System operates in an environment utilizing a client device in communication with a host server over a computer network, such as the Internet. In other embodiments, other computer networks, for example, a wide area network (WAN), local area network (LAN), or intranet, may be used. The host server may comprise a processor and a computer readable medium, such as random access memory (RAM). The processor is operable to execute certain heuristic problem-solving programs and other computer program instructions stored in memory. Such processors may comprise a microprocessor (or any other processor) and may also include, for example, a display device, data storage devices, cursor control devices, and/or any combination of these components, or any number of different components, peripherals, and other devices. Such processors may also communicate with other computer-readable media that store computer program instructions, such that when the stored instructions are executed by the processor, the processor performs the steps described herein. Those skilled in the art will also recognize that the exemplary environments described herein are not intended to limit application of the present System, and that alternative environments may be used without departing from the scope of the invention.

Various problem-solving programs incorporated into the present System and discussed further herein, utilize, as inputs, data from a data storage device. In one embodiment, the data storage device comprises an electronic database. In other embodiments, the data storage device may comprise an electronic file, disk, or other data storage device. The data storage device may store engineering and cost modules, building codes and regulations, user data, and a repository. The data storage device may also include other items useful to carry out the functions of the present System.

In one example, the problem-solving programs comprise one or more heuristic problem-solving strategies (in particular, evolutionary algorithms such as evolution strategies, genetic algorithms, evolutionary programming, genetic programming, and heuristics) to "solve" a high level problem statement defined by the user—e.g., optimizing land development at a site based on cost. Resulting optimally different solutions are transferred over the computer network to the client device. The user is then able to decide which fit solution best satisfies his or her design goals.

II. Heuristic Problem-Solving Strategy

As indicated above, the speed and effectiveness of the present System and Method may be advanced using a heuristic mathematical optimization approach, such as evolutionary algorithms (with possible instantiations, such as genetic algorithms, evolution strategies, evolutionary programming, genetic programming, and combinations of the above and their components). For certain sub-tasks, mathematical programming approaches such as linear programming, mixed-integer programming, and branch-and-bound, are utilized as well.

Concisely stated, an evolutionary algorithm (or "EA") is a programming technique that mimics biological evolution as a problem-solving strategy. Given a specific problem to solve, the input to the EA is a set of potential solutions to that problem, encoded in some fashion, and a metric called a fitness function that allows each candidate to be quantitatively evaluated. These candidates may be solutions already known to work, with the aim of the EA being to improve them, but more often they are generated at random.

As previously indicated, a high level problem statement in the present disclosure is: developing a land site for single pad commercial usage based on predetermined cost measurements and budget constraints. In the context of this disclosure, evolutionary algorithms work to evolve a set of different, either globally or locally optimal solutions—each solution conceptually satisfying (within the site) the cost measurements in a manner which is highly cost efficient, and which takes into consideration System and user constraints and user preferences.

Referring to FIG. 1, beginning at generation '0', the first step in the EA is to create an initial population of conceptual solutions. Each solution comprises respective sets of different parameters driving the optimization. This initial population may include anything from a single to thousands or more of potential solutions.

For each solution in the population, the cost measurement is defined. For example, grading costs include aspects such as the total disturbed area, total volume of excavated material, volume of excavated rock, volume of excavated unsuitable material, volume of fill material, retaining wall area, parking area, concrete sidewalk area, length of curb and gutter, and slope surface area.

After creating the initial population, the next step is to apply a fitness function which quantitatively evaluates the fitness of each candidate solution. This step involves first determining the engineering feasibility of the solution, and whether the solution satisfies the rules of selection discussed above. If the solution meets these threshold requirements, it is then scored for fitness utilizing the cost model and any applicable penalties. If not, the solution is immediately discarded. As an alternative to discarding such solutions, the Method also may provide measures to avoid the creation of such solutions at all, or to facilitate a repair of such solutions, both measures being based on using heuristics to execute the avoidance or repair.

For those solutions meeting the above threshold requirements, a fitness value is assigned to the cost measurement. In the present example, this fitness value is a measure of cost of the current solution. As previously stated, cost penalties are assigned to measurements which violate a user preference or "soft constraint". The cost of each measurement is calculated based on the cost model.

For each solution in the population, cost and penalties are added to yield the fitness value in a way which introduces weighting factors for the cost as well as the various penalty components. This can be formulated as:

$$\text{fitness} = w_c * \text{cost} + w_{p1} * \text{penalty}_1 + w_{p2} * \text{penalty}_2 + \ldots + w_{pn} * \text{penalty}_n$$

Where "cost" refers to the value of the cost function and "$\text{penalty}_i$" refers to the value of a penalty cost value for an infeasible component of the current solution. This combines cost and penalty factors into one single fitness value, which needs to be minimized. Alternatively, cost and penalty values can also be kept separately and be used in a different way to evaluate solution quality, e.g., by defining a specific order on (cost, penalty) pairs or by considering cost and penalties as separate criteria in a multi-objective optimization task, which is characterized by the fact that conflicting optimization criteria are used to determine a so-called Pareto-front of best possible compromise solutions between the conflicting criteria.

After scoring each solution in the population, the EA determines whether a known termination criterion is satisfied. In the present example, the termination criterion is a pre-selected number of rounds or "generations". Assuming that this criterion is not yet satisfied, the System then selects certain candidate solutions to be copied over into the offspring population. The EA can use many different techniques to accomplish this; namely, an elitist selection, fitness-proportionate selection, roulette-wheel selection, scaling selection, tournament selection, rank selection, generational selection, steady-state selection, hierarchical selection, (m,l)- and (m-+l)-selection (both are also called truncation selection). Some of these methods are mutually exclusive, but others can be and often are used in combination. There can also be two selection steps, one often referred to as "sexual selection" which is used for reproduction (i.e., making copies of individuals from the parent population), the other referred to as "environmental selection", which is used for reducing the offspring population size.

According to the elitist selection, the most fit solutions of each generation are guaranteed to be selected. In the fitness-proportionate selection, more fit individuals are more likely, but not certain, to be selected. The roulette-wheel selection is a form of fitness-proportionate selection in which the chance of a solution being selected is proportional to the amount by which its fitness is greater or less than its competitors' fitness. According to the scaling selection, as the average fitness of the population increases, the strength of the selective pressure also increases and the fitness function becomes more discriminating. This method can be helpful in making the best selection later on when all solutions have relatively high fitness and only small differences in fitness distinguish one from another. In the tournament selection, small subgroups of solutions are repeatedly chosen at random from the larger population, and members of each subgroup compete against each other. Only one—namely, the best—solution from each subgroup is then chosen to reproduce. In the rank selection, each solution in the population is assigned a numerical rank based on fitness, and selection is based on this ranking rather than absolute differences in fitness.

This method can prevent very fit individuals from gaining dominance early at the expense of less fit ones, which would reduce the population's genetic diversity and might hinder attempts to find an acceptable solution. In the generational selection, the offspring of the solutions selected from each generation become the entire next generation. No solutions are retained between generations. In the steady-state selection, the offspring of the solutions selected from each generation go back into the pre-existing population, replacing some of the less fit members of the previous generation. Some solutions are retained between generations. In hierarchical selection, solutions go through multiple rounds of selection each generation. Lower-level evaluations are faster and less discriminating, while those that survive to higher levels are evaluated more rigorously.

This method reduces overall computation time by using faster, less selective evaluation to weed out the majority of solutions that show little or no promise, and only subjecting those who survive this initial test to more rigorous and more computationally expensive fitness evaluation. In (m,l)-selection, the best solutions are deterministically chosen out of l solutions in the offspring population (l being larger than m in this case) to form the parent population of the next iteration of the evolutionary algorithm. This method is relatively simple and supports the self-adaptive capabilities of an evolution strategy, and it allows the algorithm to escape from local optima towards globally optimal solutions. In (m+l)-selection, the m best solutions are deterministically chosen out of the m solutions in the parent population plus the l solutions in the offspring population, to form the parent population of the next iteration of the algorithm. This method is elitist, i.e., it guarantees that solutions do not become worse during the optimization process. Both (m,l)- and (m+l)-selection are also rank-based selection methods, and both are used in the evolutionary algorithm as "environmental selection" methods (i.e., after the creation and evaluation of new solutions—the offspring individuals—has taken place).

In one example, a rank selection method such as (m,l)-selection chooses all m candidate solutions which have the best (i.e., minimum) cost and penalty function values among all l solutions in the current offspring population.

Once selection has chosen fit solutions, they are then randomly altered in hopes of improving their fitness for the next generation. This random alteration occurs through mutation and crossover. A solution is mutated by slightly altering the individual parameters. This mutation can also involve the self-adaptation of one or more variances and covariances of a suitable mutation distribution, such as a normal distribution. A possible instance of self-adaptive mutation changes a coordinate vector $x=(x_1, \ldots, x_n)$ with one associated variance (standard deviation) by the following mathematical procedure:

Generate a new value of s, denoted s', by: $s'=s*\exp(t*N(0,1))$

Figure 2:
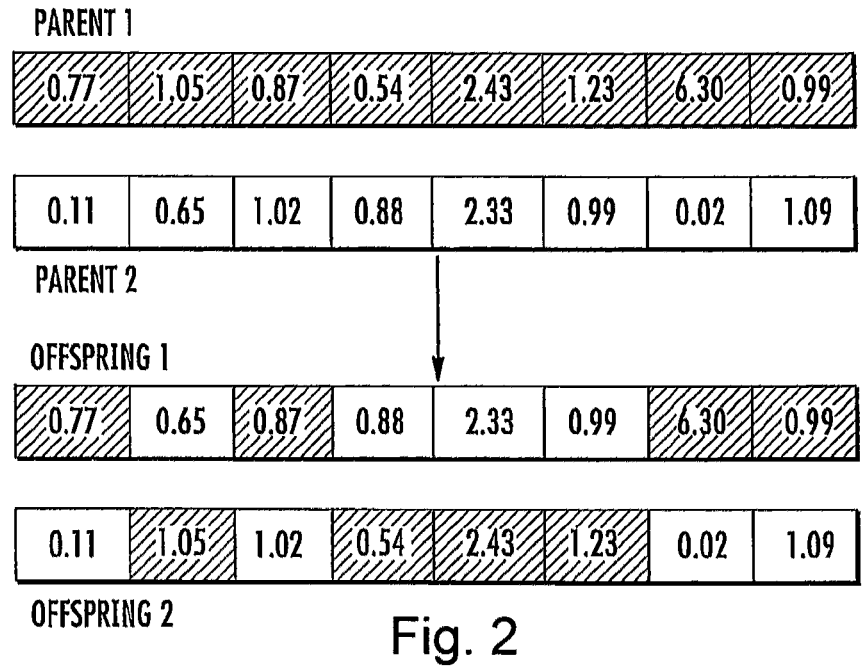
FIG. 2 illustrates an exemplary application of crossover.
Figure 3:
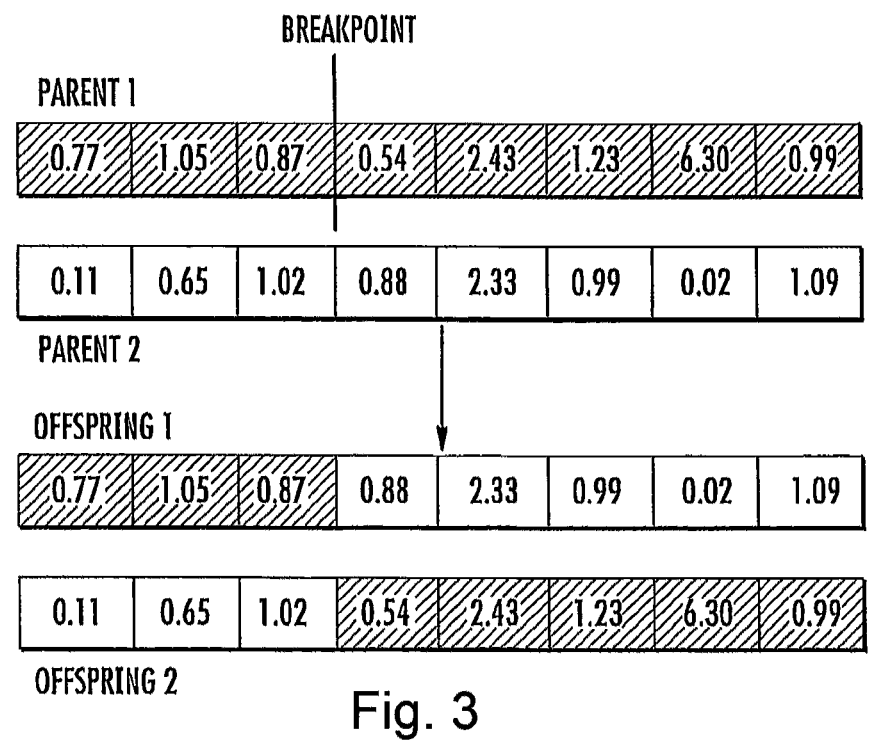
FIG. 3 illustrates an exchange of consecutive segments of information after one breakpoint or between breakpoints.
Figure 4:
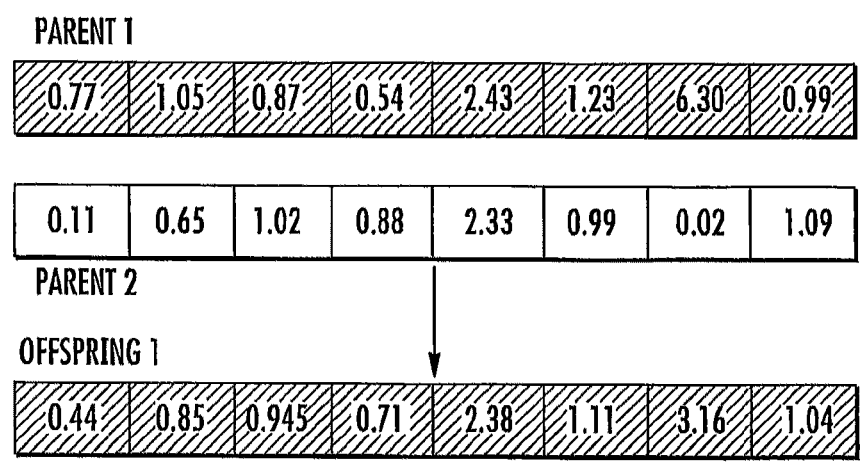
FIG. 4 illustrates an example of averaging one or more parameters between two or more solutions in an exemplary evolutionary algorithm.

Loop through all values of $i=1, \ldots, n$ and generate a new value of $x_i$, denoted $x'_i$, by: $x'_i=+s'*N_i(0,1)$ Here, $N(0,1)$ is a random number according to a normal distribution with mean zero and expectation one. t is a parameter of the method, which can be set to a value of $1/\text{sqrt}(n)$. Crossover entails choosing two or more solutions to swap one or more parameters, thereby producing artificial "offspring" that are combinations of their parents. With crossover, there is a transfer of information between successful "individuals"—solutions that can benefit from what others have learned, and schemata can be mixed and combined, with the potential to produce an offspring that has the strengths of both its parents and the weaknesses of neither. A common form of crossover called uniform crossover (in evolution strategies also called discrete recombination) allows a 50% chance for each parent individual to contribute a parameter to the newly formed solution. A schematic example of crossover is provided in FIG. 2. In this example, parameters are exchanged between two solutions (denoted as "parent 1" and "parent 2") to yield two new solutions (denoted as "offspring 1" and "offspring 2") by exchanging parameter values at random with a 50% chance for each position to exchange or to stay. Also, consecutive segments of information after one breakpoint or between breakpoints can be exchanged, which is shown in FIG. 3 (where the random breakpoint occurs after position three). All of these crossover operators generate two or more new solutions, which can either all be used, or only one of them, which is then typically chosen at random among the new solutions generated. Evolution strategies, as used in the present example, choose one of the new solutions. Also, averaging one or more parameters between two or more solutions is a possible form of crossover used by the evolutionary algorithm. An example of this version of crossover (in evolution strategies also called intermediate recombination) is shown in FIG. 4. This operator typically generates one new solution only. Also, rather than averaging, any other arithmetic combination of one or more parameters between two or more solutions can be used as a possible form of crossover.

This evolutionary strategy algorithm can be combined with local heuristics as well. The local heuristics assure that the operators of the evolution strategy, specifically the mutation operator, take the local constraints into account, such that feasible points are generated by the mutation operator.

III. Overview of Optimization Engine

The present System employs an Optimization Engine (or "Optimizer") which is divided into three-distinct solvers, discussed separately below. These solvers allow users the option to implement only a desired portion of the System's overall functionality, and thereby speed up the optimization process.

The three separate engineering solvers include the layout solver, the grading solver, and the utility solver.

(i) Layout Solver:

The layout solver operates to layout a site; add parking spaces, side walks, driveways, pavement and other 2D features on the site. The objective is to optimize the location of the building on the site given all the layout constraints entered by the user.

(ii) Grading Solver:

The grading solver optimizes the proposed grade on the site given a certain fixed layout, so that the earth work is feasible and optimal. This solver considers user constraints such as minimum and maximum slopes, retaining walls, and curbs.

(iii) Utility Solver:

The utility solver optimizes the pipes and inlets on the site. This solver considers factors including pipe sizes, depths, the flow of water on the surface, and flow in the pipes.

Figure 5:
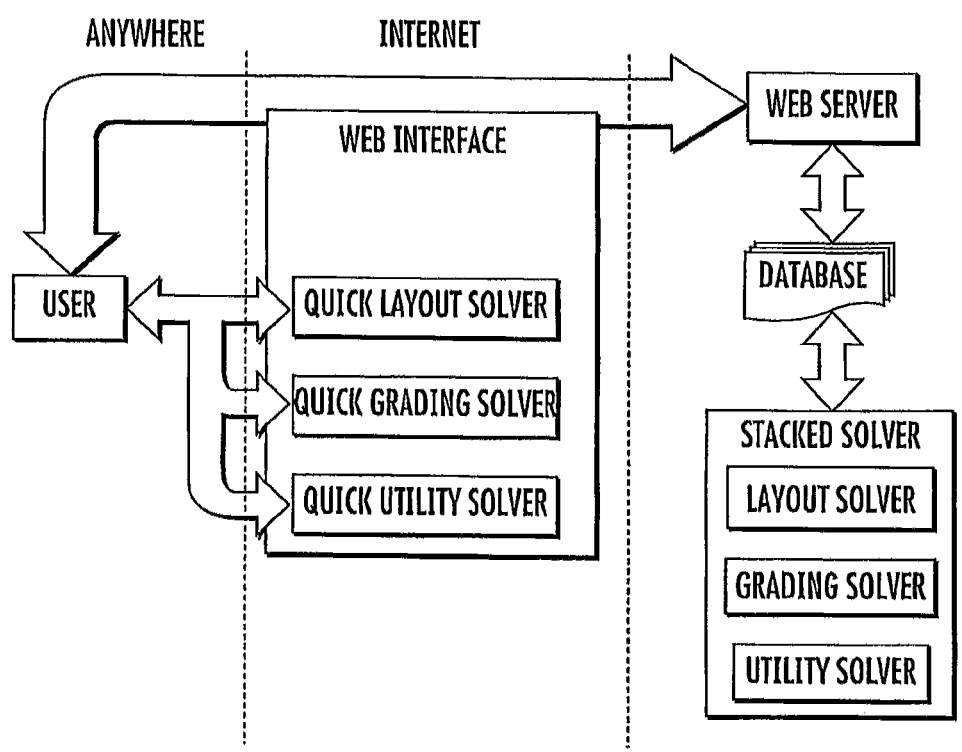
FIG. 5 illustrates user access to online and offline optimization/simulation.

The three solvers can not only be used individually, but can also be stacked to combine two or all three to achieve more detailed information. Stacking the solvers impacts the complexity of the optimization, and therefore the speed at which one or more "good solutions" are calculated. Because stacking the solvers increases the complexity of the optimization, the solvers are generally not stacked when run online. Online runs may be referred to as "quick solvers" or "simulations". FIG. 5 illustrates user access to online and offline optimization/simulation.

Optimization and Simulation

Multiple optimizations occur in the different solvers. The following discussion outlines how these optimizations are performed and which settings may be used.

(i) Evolutionary Loop

An evolutionary algorithm (EA) uses an evolutionary loop to evolve a 'pool' of individuals using 'selection', 'copying', 'recombination' and 'mutation' to constantly improve the individuals in an effort to find an optimal solution. An extensive introduction into EA is provided separately below and will therefore not be repeated, instead the following discussion focuses on how the layout solver implements this evolutionary process.

Figure 6:
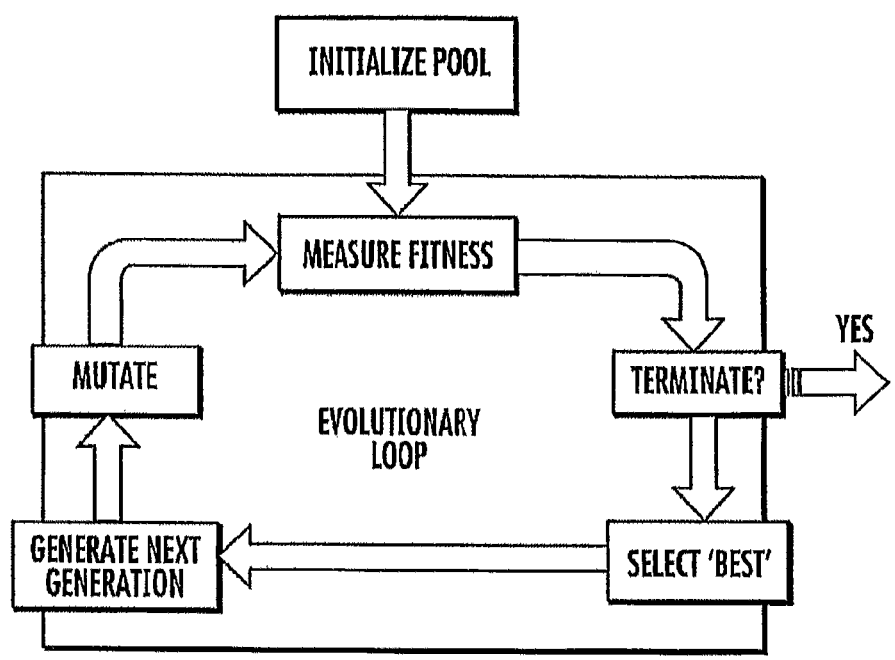
FIG. 6 demonstrates an exemplary evolutionary loop.

FIG. 6 shows a general evolutionary loop. First, an initial population, or 'pool', of individuals is generated. The size of this population generally stays fixed throughout the evolutionary process. The quality, or 'fitness', of each individual is measured using the fitness function, after which the termination criteria are checked. Usually, the loop is terminated after a set number of generations, but the top fitness or fitness change over time can also play a role in this. Next, the 'best' individuals are selected. The set of, best individuals does not always have to be the set of individuals with the best fitness. (See discussion regarding 'optimally different' and 'niching' where this may not be the case.) The selected individuals are used to form the next generation. This can be done using recombination, but copying is also often employed. The next generation is usually the same size as the initial one, but is generated using only the best individuals of the initial generation. This next generation is mutated to hopefully change in the right (or better) direction. The way an individual is mutated can be problem dependent, but in most evolutionary strategies a 'step size' is, used to influence the size of the change that is inflicted. Strategically changing this step size can then influence the performance of the algorithm significantly. After mutation is done, the loop is closed by recalculating the fitness of each individual. Because the pool now consists of individuals close to the best ones in the last generation, the expectation is that the fitness values of this generation are now improved.

In one implementation, this evolutionary process is used in areas where all other optimization processes fail to perform. This means that if a mathematical alternative is found for a certain subset of the problem, this alternative is generally preferable. An evolutionary process is normally not deterministic, and will therefore not generate the same answer twice. And, because the search space of most real world problems is too big to consider all possible answers, the solution generated by an evolutionary algorithm can never be proven to be the best solution. Evolutionary algorithms are relatively flexible though, and perform well in situations where other optimization algorithms are unusable to find a solution.

(ii) Optimization Vs. Simulation

The present Optimization Engine is both an optimizer and a simulator. These two concepts are often confused, and are therefore explained below.

Simulation in terms of computer programs is the process of mimicking what would happen given certain inputs. This can be a case of analyzing an industrial process over time, calculating a model of the weather or, as in this case, trying to apply 'common sense' to a land development problem. A simulation is usually deterministic, and gives only one answer.

Optimization in terms of computer programs is the process of optimizing what can be given certain constraints. An important difference to simulation is the fact that the computer is trying to find the best inputs to match the problem and its constraints, instead of analyzing a set of given inputs.

The present layout solver has both an optimization component and a simulation component, and in some parts, the solver may do a little of both. How the solver operates is based on certain assumptions made by the System. Every assumption is in effect a restriction to the Optimization Engine; it tells the Optimization Engine where it does not have to look for the best solution. Every assumption therefore decreases the search space and, in general, increases the speed of the optimization process. A poorly chosen assumption however could have a significant impact on the quality of the candidate solutions. In effect, every assumption that is made moves a part of the problem from the realm of optimization into the real of simulation. In other words, instead of trying to find the best solution for a sub-problem, it is assumed to be optimal in a certain way, making the solution of that sub-problem deterministic and more of a simulation than an optimization.

IV. Engineering Solvers

A. Layout Solver

Figure 7:
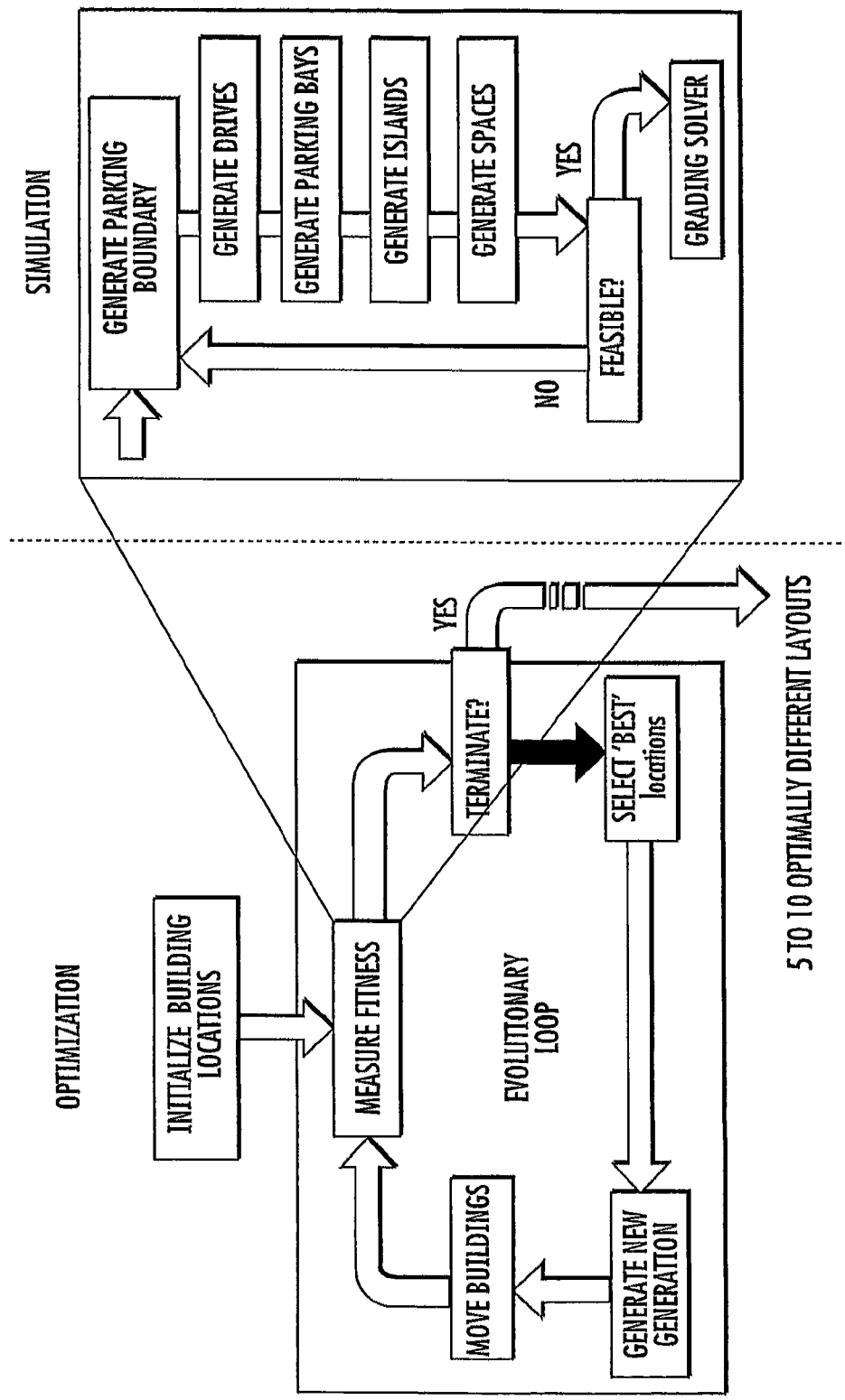
FIG. 7 outlines an exemplary layout solver.
Figure 8:
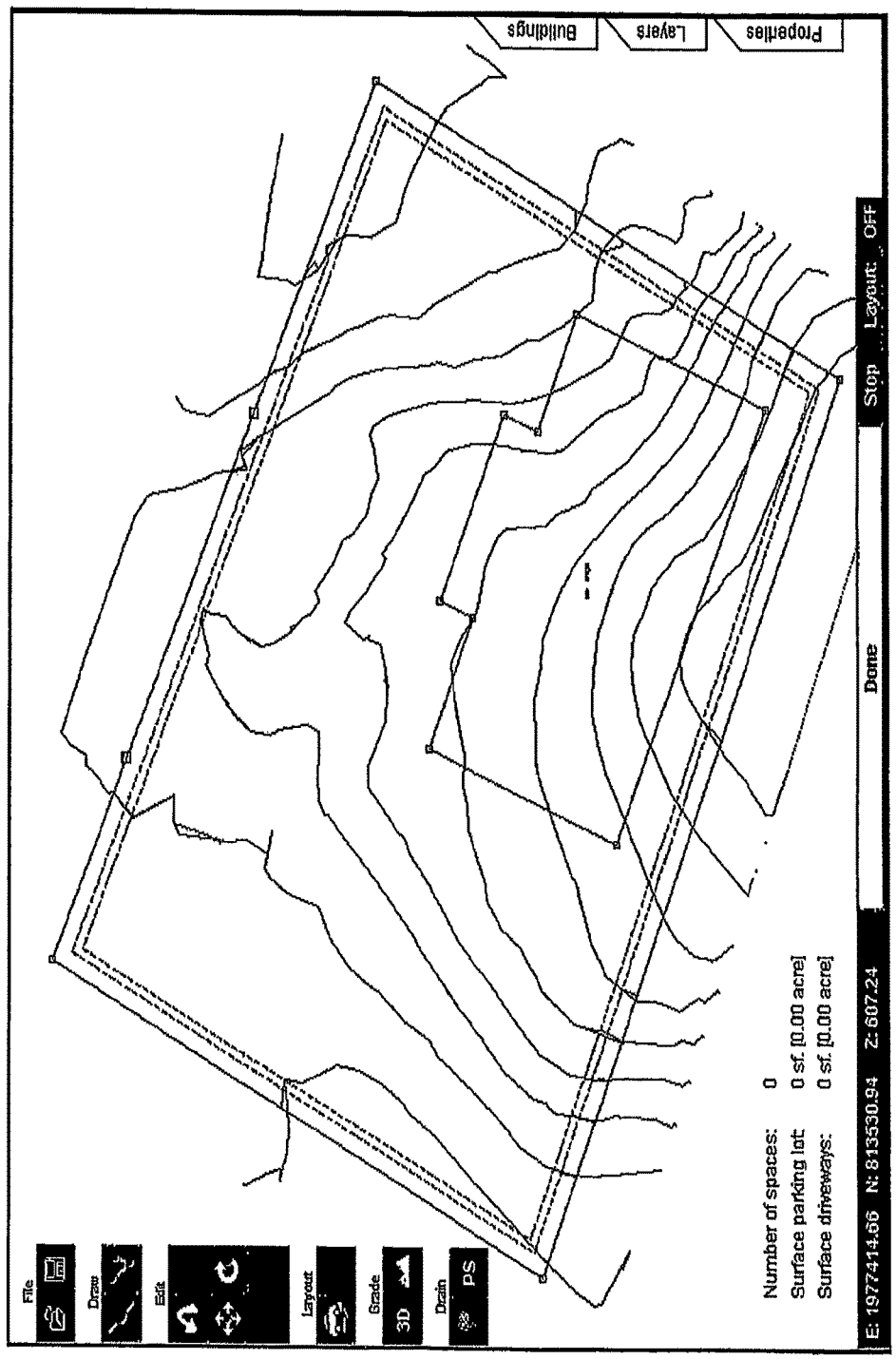
FIGS. 8 and 9 show before and after layouts of exemplary sites.
Figure 9:
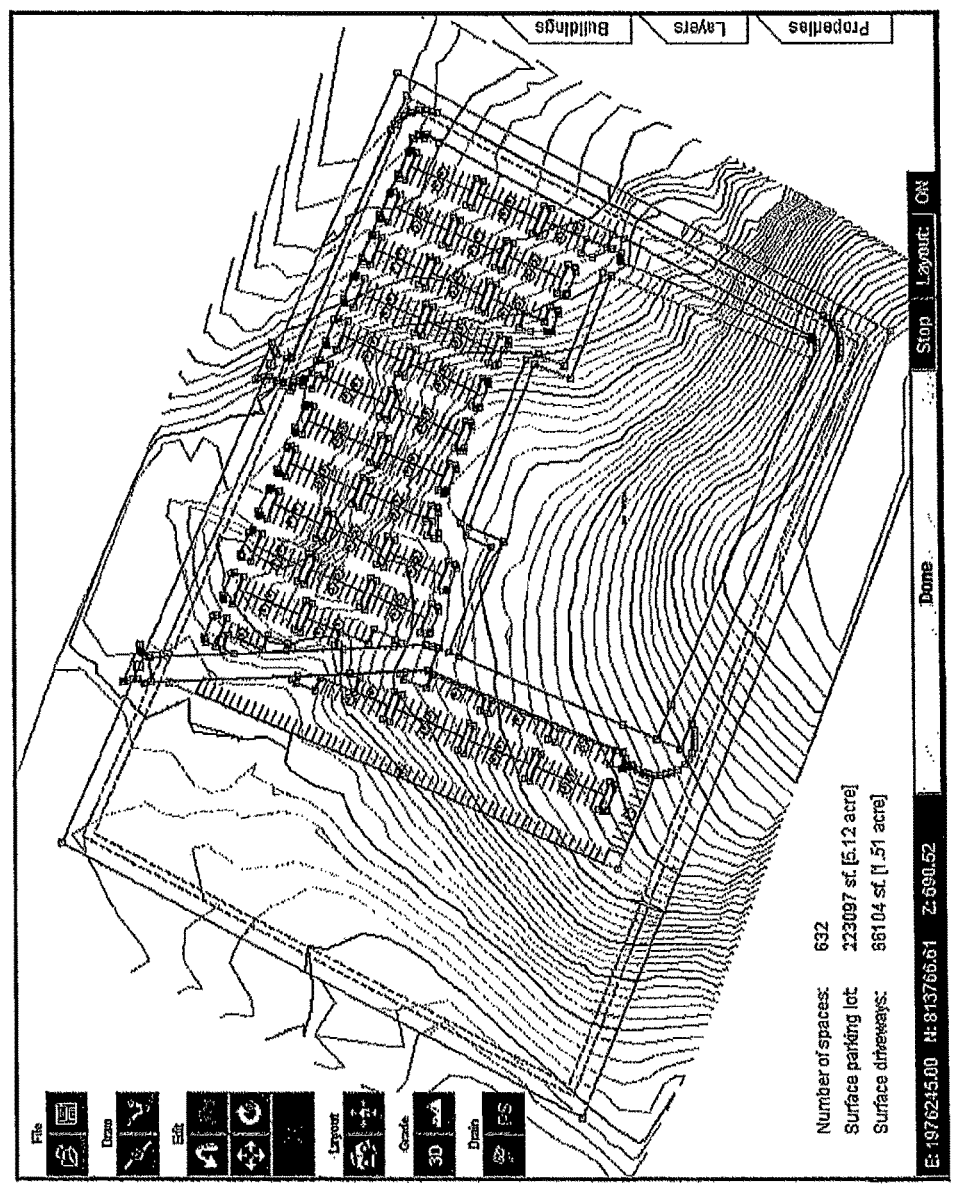

The optimization component of the exemplary layout solver is described below. FIG. 7 outlines the layout solver and its inner-workings. Examples of before and after layouts are provided in FIGS. 8 and 9, respectively. Before the layout solver is run (FIG. 8), the user must enter only basic features of the overall site, such as property line, building, and topographical data. After running the layout solver (FIG. 9), the System has created parking lines, parking area, driveway access, truck drives to building, and sidewalks. Users can control what layout options are considered by providing rules for the system to follow, such as:

Building setback is 150 feet from property line.
No parking is allowed behind the building.
Truck drives must be 60 feet wide.

The optimization component of the layout solver is the mechanism that seeks to find the best location of the building. To measure the quality of a location of the building, the simulation component of the layout solver is used to simulate where the rest of the layout will go as a result of the location of the building. In terms of an evolutionary algorithm (EA), the optimization component is the 'evolutionary loop', whereas the simulation component comprises the 'calculation details,' and an "individual" is considered a particular location of the building on the site. Details of this approach and specific settings are given in the following discussion.

(i) Individual

The individual in the optimization of the layout solver is a location of the building. In the case of a multi-pad commercial site, this can be the location of multiple buildings. In the case of commercial sites, users may also want to optimize the location of ponds or advertisement signs making these items part of the individual.

A location of the building is defined as the center of the building-in-terms of northing and easting, plus the rotation of the building given a certain original shape.

(ii) Mutation

Figure 10:
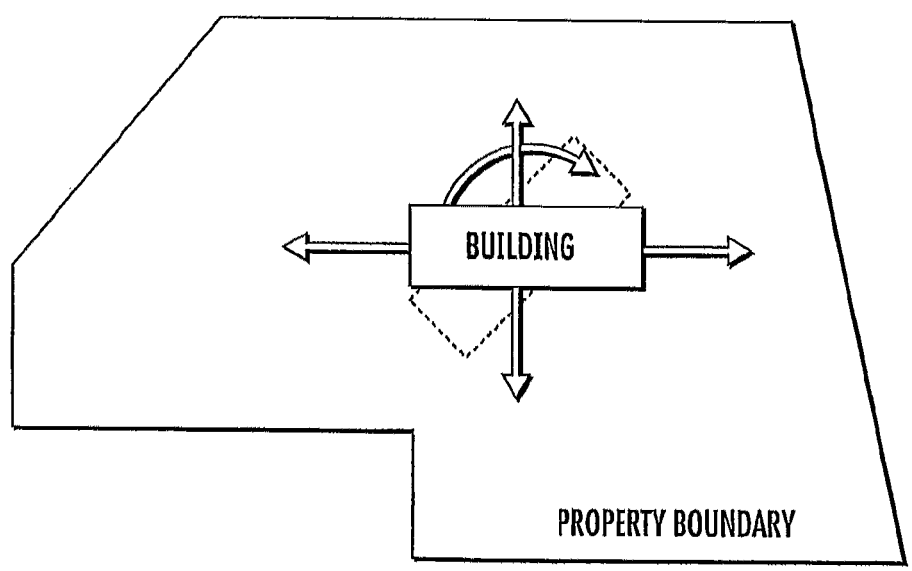
FIG. 10 shows an exemplary building location.

Mutation of an individual is done by moving and rotating the building. The amount of movement and rotation is Gaussian random distribution with a standard deviation of a certain step size $\sigma$. This step size starts at a reasonable size, such as: diagonal site/$\lambda$, where $\lambda$ is the population size, and can be changed according to a number of strategies. One successful strategy that is employed is 'self adaptation', which uses the evolutionary principle to evolve the best step size at the same time the location of the building is evolved. FIG. 10 shows an example of a building location and its permutations.

The mutation of an individual is constrained by numerous real-world logistical problems. Most of these problems are only checkable by trying to put drives, islands and parking on the site; but some, like checking if the building is inside the building setback, are performed before the fitness evaluation. Locations that are infeasible, such as this, are not considered in the fitness evaluation.

(iii) Optimally Different Selection or 'Niching'

Figure 11:
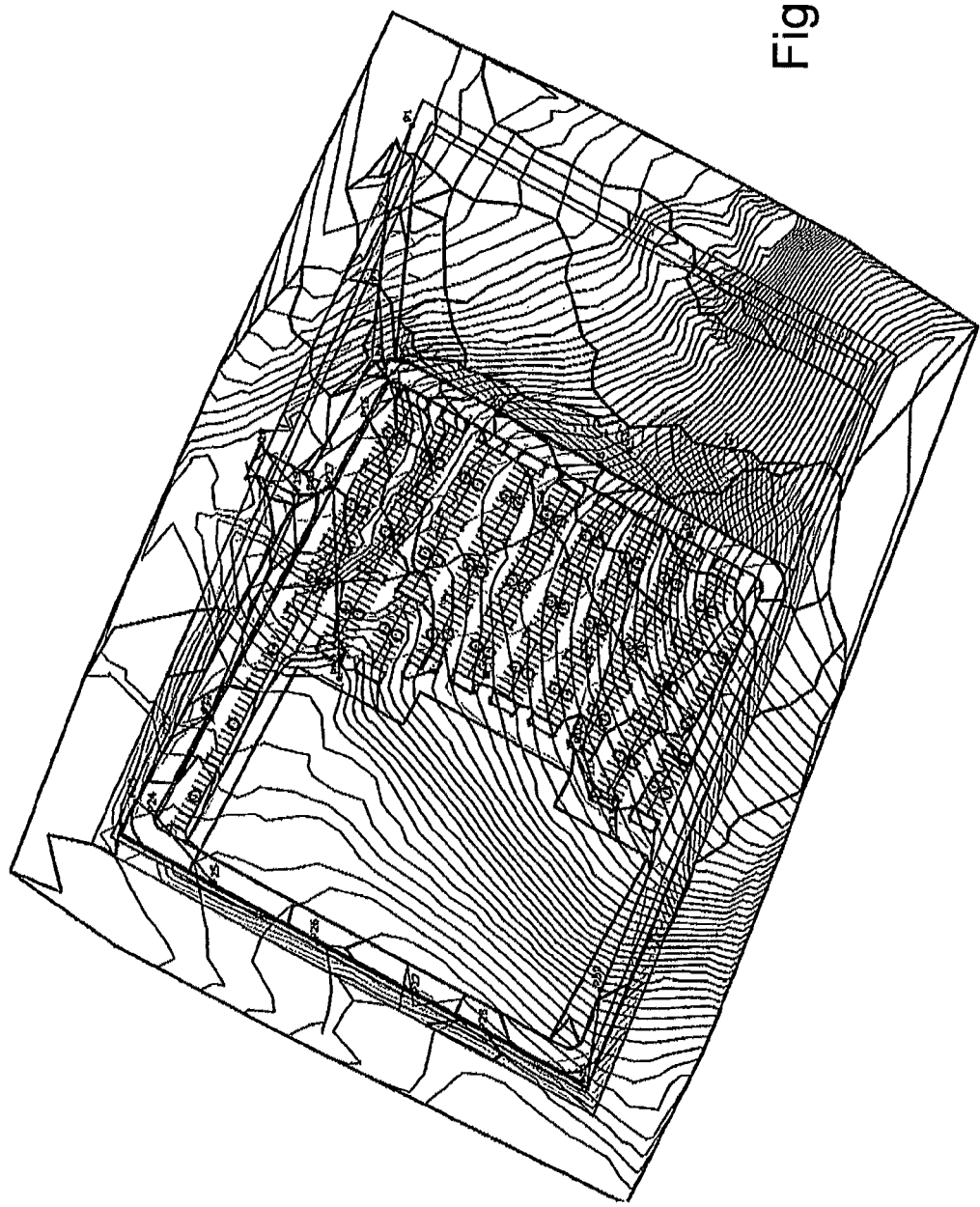
FIGS. 11 and 12 illustrate exemplary "optimally different" solutions.
Figure 12:
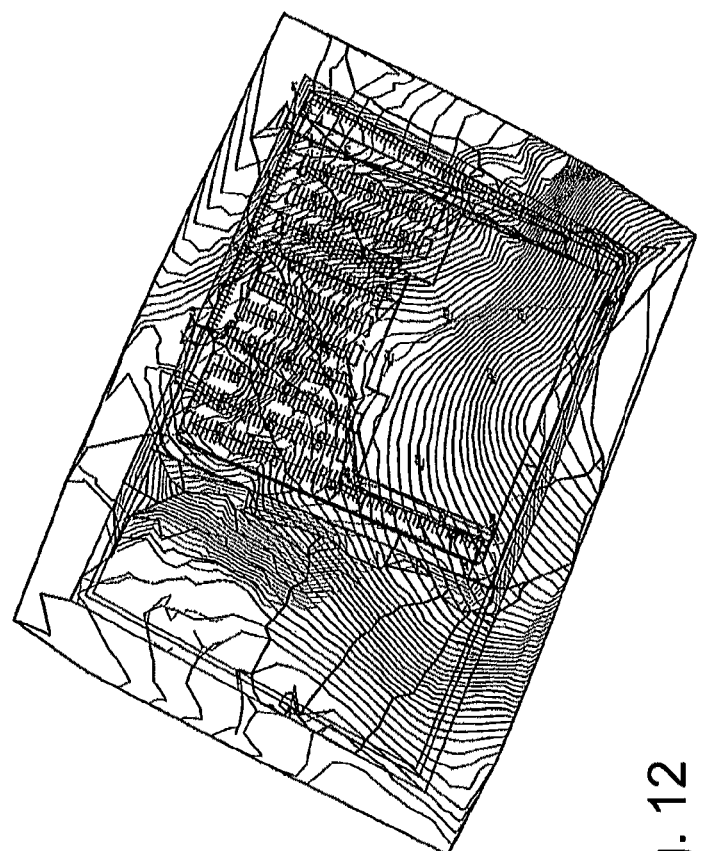

In one implementation, selection in the layout solver is done according to that referred to as 'niching'. The layout solver not only seeks to calculate the best solution, but there is also value in returning different solutions. To a civil engineer or land developer, five different "pretty good" solutions might provide a much better understanding of the possibilities for a given site than five very similar (and perhaps better) solutions. FIGS. 11 and 12 illustrate two "optimally different" solutions.

Generating optimally different solutions is achieved by reformulating the definition of a 'good individual': An individual that has the best fitness in its local neighborhood. The term 'niche' refers to this local neighborhood, hence the term 'niching'. Instead of selecting the $\mu$ (=number of parents) individuals with the highest fitness during selection, as is normally done, selection now selects only the single best individual. All the individuals in the immediate neighborhood of this best individual are now removed, and the best remaining individual is selected. The process is repeated by removing the immediate neighborhood of the second individual and selecting again, until all individuals are removed or μ individuals are selected.

Defining the neighborhood of an individual is an important step for this type of selection. Generally, the neighborhood is defined by a radius ε. In the case of the building's northing and easting location, this is relatively straightforward, but in the case of the rotation, it becomes more complicated.

Two buildings are considered to be in the same neighborhood if and only if:

The centers are no more than ε=(diagonal of the site/c) feet apart

The rotation angles are no more than 45 degrees apart (Setting c is closely related to the selected number of parents; and c=μ is not uncommon)

If the number of niches drops below μ, then the best individual unselected from every niche is selected until μ is met.

(iv) Fitness Function

The fitness function of the layout solver simulates the impact of the building location on the location of the remaining features of the layout. Fitness can be measured differently according to the different constraints set in the building. The stacking of the solver also impacts how the fitness function is defined. If the layout solver is run stand-alone (by itself), no costs are calculated. If the layout solver is stacked on top of the grading solver, the fitness is the grading cost which is minimized or optimized. If the layout solver is stacked on top of the grading solver and the utility solver, the fitness is the total cost which is minimized/optimized.

A user-defined minimum number of parking spaces required for a certain building changes the definition of 'fitness' in a stand-alone layout solver. If this number is not defined, the solver seeks to maximize the number of parking spaces using the entire site. If this number is set, then the solver seeks to minimize the area needed for the parking spaces using a sub-area of the site. This is used as a fitness for a building location when the layout solver is not stacked.

(v) Iterative Loop

By eliminating certain potential building locations using heuristics, the task of considering all remaining building locations on the site becomes feasible.

A significant difference between this approach and the evolutionary loop is the manner in which the location of the building is defined. This is no longer done with nothing, easting and rotation, but by selecting two sides of the property, one side of the building and two offsets.

Using this iterative loop instead of the evolutionary loop is generally more reproducible. However, this approach requires numerous assumptions in order to iterate through the search space. Another concern is that the now-simplified problem can still have an overly vast number of possibilities, or candidate solutions. The complexity is reduced to O(n4) which is polynomial, but can grow rapidly. As such, this approach is especially useful in single-pad commercial land development.

In some cases, the user already knows which side of the building needs to be aligned with which side of the property boundary. This input further reduces the search space. The complexity in this case is reduced to O(n2). Because this creates a large reduction in the number of candidate solutions, the quality of these solutions can be improved by decreasing the steps in the offsets and increasing the offsets.

A similar approach can be employed to improve the quality on smaller sites. If the number of possibilities is small, the steps in the offsets can be reduced and number of steps increased accordingly.

The layout solver generates different feasible site layouts and seeks to find the 'best'. The definition of what the best layout depends on what other solvers are 'stacked' on top of this solver and some specific constraints on the layout solver:

No solver stacked and no minimum number of parking spaces: the solver seeks to maximize the number of parking spaces gives the boundary constraints.

No solver stacked with a minimum number of parking spaces: the solver seeks to minimize the pavement needed for the number of parking spaces.

Grading with optional utility solver stacked on top of the layout solver: the solver seeks to find the layout that is least costly in the total cost of the project.

The layout solver generates one layout for every position of the components it can lay out. In one implementation, the layout solver positions only one building and then builds the site around this one building. In other implementations, the layout solver may position multiple buildings and areas like ponds, waste containers, and such. To the layout solver, these areas are indistinguishable, and their use is defined by the constraints that exist on the area.

Apart from the movable areas, the layout solver also deals with fixed areas. These can be considered spatial constraints, such as easements.

Driveways are defined in terms of center points. The layout solver then generates the driveways to the parking lot or the building, depending on the constraints that are defined on both the center points and the building.

(i) Positioning a Building

The building can be positioned in two ways:

Using an evolutionary loop

Using an iterative loop

Both ways are discussed further below.

(ii) Defining the Sidewalk

A sidewalk can be added to a building by the user. It becomes attached to the building and moves and rotates with the building. Every side of the building has a predefined sidewalk width. This is defaulted to 0.

(iii) Defining the Parking Lot

Figure 13:
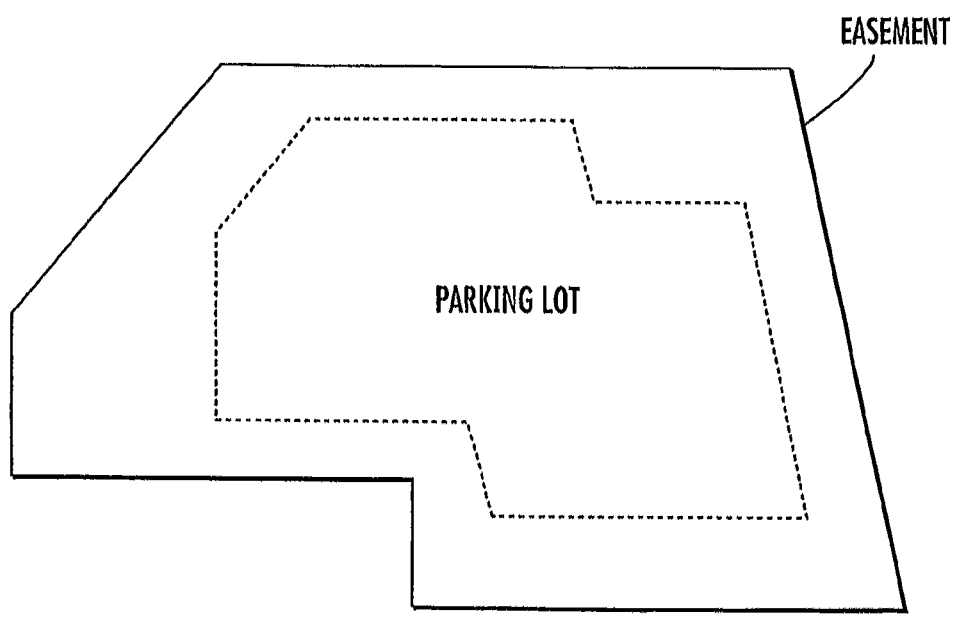
FIG. 13 illustrates an exemplary parking lot with no minimum number of parking spaces set for the building.

The term 'parking lot' refers to the area in which parking is allowed. In case of the layout solver, this is translated into: 'the area in which parking is maximized'. Consequently, if there is no minimum number of parking spaces set for the building, then the parking lot is the entire property boundary minus the parking setback and the easements inside that boundary. FIG. 13 provides an example of such a parking lot.

Note that in some cases the parking lot is cut into multiple pieces by the parking setbacks or the easements. This is considered to be feasible, but can result in inaccessible parking spaces.

(iv) Laying Out a Driveway

A driveway is defined as a polyline with a setback (and including factors such as the number of entrances/exits, curb radiuses, corner radiuses, type of pavement, and stacking distance). A driveway always has a 'source' and a 'target'. The source can be either a driveway center point or another driveway, while the target can be either a parking lot or a side of an area with a direction. This direction is either 'parallel' or 'perpendicular' in describing the way to connect to the side in question.

Connecting the source to the target can be done in several different ways, but the layout solver tries to find the least costly alternative.

If a drive overlaps the parking lot, that area of the parking lot needs to be cut. Note that this can again make for multiple parking lots that are all very feasible.

(v) Laying out Parking Lots—Parking Bays and Parking Spaces

Generated parking lots are 'filled' with parking spaces. The idea is to maximize the number of parking spaces. This is done by maximizing the number of spaces for every parking lot separately. Some heuristics/assumptions are used to achieve this:

Parking bordering the boundary of the parking lot maximizes spaces.

Parking against the building maximizes spaces.

Parking bordering the boundary should precede parking around the building.

Various parking lot design considerations and drawing features of the present System are described in further detail below.

Automated Parking Area Design

In the present disclosure, the term "parking area" refers broadly and generally to any 2D or 3D space designated for vehicle (e.g., car) parking within a land site including, for example, one or more parking lots, parking spaces, parking bays and islands, parking decks and garages, pedestrian sidewalks and crosswalks, ingress and egress roadways, other pathways, and the like. The parking area may comprise or be included within an undeveloped land site. The tools and features discussed herein relative to conceptual parking area layout and design may be used separately and independently for any given land site, or in combination with other heuristic problem-solving strategies employed to optimize single-pad commercial, multi-pad commercial, residential, and other land sites.

In one exemplary implementation, the data structure of a parking lot has the following characteristics:
  a. The user first lays out an 'area' in which parking is 'desired'. This area is called a 'Desired Parking Lot Area'.
  b. There are properties associated with each side of the area and the area as a whole.
  c. On the sides there are defined properties, such as:
    i. 'Allow Parking' (which toggles whether there is parking on that side of the area or not)
    ii. 'Parking Depth' (which sets the depth of the parking spaces on that side)
    iii. 'Parking Width' (which sets the width of a single parking space on that side)
    iv. 'Aisle Width' (which sets the width of the aisle offset from that side of the area)
  d. On the area as a whole there may be defined properties, such as:
    i. 'Center Aisle Width' (which sets the width of the aisles crossing through the center of the parking lot)
    ii. 'Parking per Island' (which determines how many parking spaces area allowed in a parking bay before the an additional island needs to be added)
    iii. 'Parking Depth/Width' as well (which here sets the parking depth/width for all the parking spaces in the center area of the parking lot)

And then there are additional points and areas that can be drawn to add small details to the parking lot, such as handicap parking spaces, dumpster pads, shopping cart spaces, and more.

To create a parking lot, the user draws one of these Desired Parking Lot Areas in a graphical layout tool, and then enter (via input button) an 'Auto Draw' feature. The System then automatically lays out a parking lot inside the Desired Parking Lot Area using all the current settings on all the sides of the area and the area itself. While this Auto Draw feature is switched on, the user can continue making changes to the data structure of the parking area which the computer will then immediately incorporate in the lines that are drawn inside the parking lot. The user can also move the points of the area, or even the entire area itself, while Auto Draw is switched on also with immediate effect—adding points, removing points, all dynamic additions to a highly interactive automatic drawing feature.

In the following example, the present System employs an "offsetting and cutting algorithm" to automatically layout a parking lot step by step showing at each step the lines that are offset/drawn and what method/rule it uses to do so.

Figure 14:
FIGS. 14 through 24 demonstrate an exemplary computer process for automatically drawing a parking lot.
Figure 15:
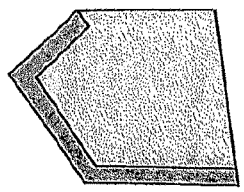
Figure 16:
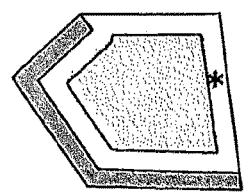
Figure 17:
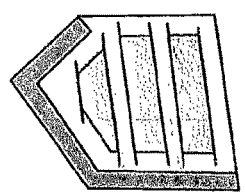
Figure 18:
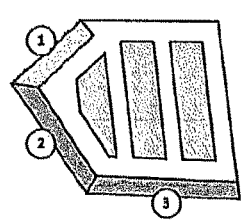
Figure 19:
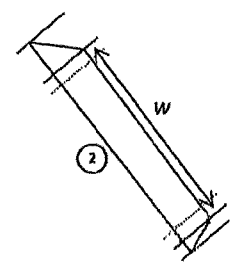

1. In a simple desired parking lot area, there are five sides—two of which do not allow any parking, while the other three do. The first step is offset the sides that allow parking towards the center of the parking lot with the parking depth set on those side. See FIG. 14.
2. The line on the inside of the outside parking is then offset inwards again by the full width of the aisle on each and every side. (The present example assumes that each side has the same aisle width set for explanation purposes.) See FIG. 15.
3. Note that because the offset line for this center area can overlap itself, there can be multiple center areas after this step (to keep it simple, the example assumes that there is only one). The next step is to use the center area to generate parking bays in a certain direction. The direction in which these parking bays are generated has a significant impact on the number of parking spaces that can fit on this parking lot. Because of the speed of the computer system many different directions can be calculated and drawn in the background before the best direction is chosen and used. For the sake of simplicity, the example assumes the direction of the marked side is the optimal. The next step is to then offset that line towards the center, first with twice the parking depth then with the center aisle-width, then again with twice the parking depth, and so on until every part of the center area is either part of a parking bay, or part of an aisle. See FIG. 16.
4. The spaces generated using the aisle width are now considered center aisles and the cutout pieces of the parking center are now considered parking bays. Although this begins to resemble a parking lot, the islands and spaces still need to be added. This is done in two steps: the islands and spaces on the outside of the parking, and the islands and spaces in the parking bays. See FIG. 17.
5. Generating parking on the outside of the desired parking lot area begins by cutting outside areas into "chunks" of parking that are sufficiently straight to support an uninterrupted row of parking without requiring an island due to a sharp bend. In the present example, all of the corners in the parking lot are too big to have a parking space in the corner, and three separate chucks are the result. See FIG. 18.
6. Each chunk will then get its own parking spaces. This is done by first calculating the number of parking spaces that can maximally fit inside of the chunk. All four end corners are extended towards the opposite line, and the distance between the closest lines is then used as the maximum parking surface. Because the parking spaces have a fixed width and there can never be half a parking space, the actual parking surface is slightly smaller and is equal to ParkingWidth*floor(w/ParkingWidth). Both closest lines are then offset half of the difference to generate exactly the correct distance for the maximum number of parking spaces. See FIG. 19.

Figure 20:
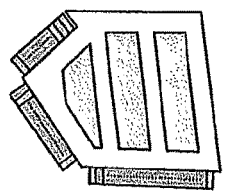

7. Applying Step 6 above to all three chunks gives three rows of parking spaces that can be drawn with the right widths on the outside of the parking lot. Note that the gaps that are generated by cutting the chunks this way automatically generates the islands. See FIG. 20.

Figure 21:
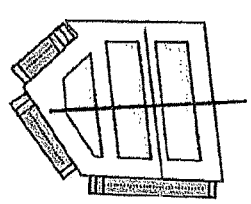

8. Next, parking needs to be added to the parking bays in the center of the parking lot. A sync-line is generated perpendicular to the direction of the aisles in the center that will determine where the parking is going to be lined up. The location of this line has a slight impact on the number of parking spaces that can be generated. The System therefore tries different locations to see which one generates the most parking. See FIG. 21.

Figure 22:
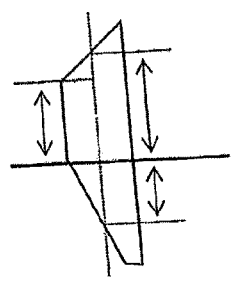

9. To put parking into a parking bay, first the center line of the parking bay is established. Then, on each side of the bay the maximum parking surface is determined by extending the four corners to the opposite side again (not unlike Step 6), but instead of measuring the distance between the two ends of the bay, the distance between the sync-line and the ends of the bay are used. The lines are moved inwards in a similar fashion though the parking is generated on both sides. Note that the situation shown in FIG. 22 is a relatively simple one. Due to the offsetting and cutting algorithm in previous steps, the parking bay can have many more difficult shapes which could generate multiple parking rows on one side of a parking bay.

Figure 23:

10. Parking spaces can now be added to the parking bays, which then automatically generates the islands in the gaps that are not filled with parking. See FIG. 23.

Figure 24:
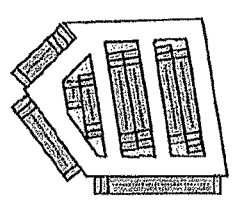

11. Completing Step 10 above for all parking bays adds all the parking spaces into the parking center and also generates all the islands. To finish the Auto Draw of a parking lot, the sharp edges in the drawing are smoothed out slightly by adding arc in the corners of islands and on the outside of aisles. The end result is a generally detailed drawing of a parking lot with aisles, parking spaces and islands. See FIG. 24.

Figure 25:
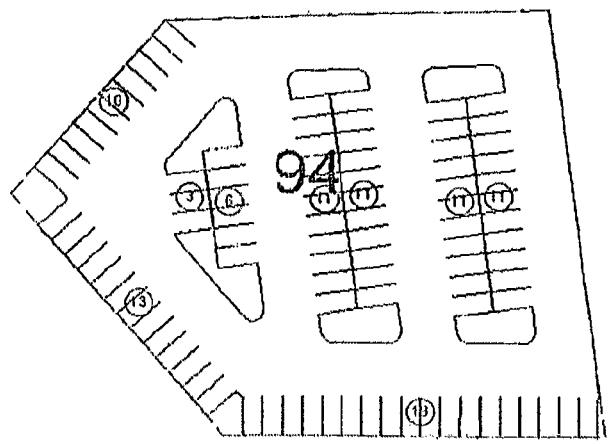
FIG. 25 is one example of a software-generated parking lot.

The resulting System generated parking lot is shown in FIG. 25.

In the current implementation of this algorithm, the System can draw about 20,000 parking spaces per second, and can therefore be called 'highly interactive' in the sense that the impact of changes by the user can be seen immediately.

A. Multiple Parking Lots

In a slightly more complicated site, there often exists multiple parking lots that are touching. These touching parking lots usually have different parking settings and therefore different looking parking spaces and islands, and could share aisles. This adds to the already complicated and cumbersome process of drawing parking lots.

The software of the present System may also handle users drawing parking lots that overlap, and may be capable of making a decision on which parking settings will be applied to the area that is overlapping. The present exemplary algorithm handles all cases of overlapping parking lots, which could then be used as the way to connect two parking lots as well.

This System enables the drawing of multiple dynamic, automatically drawn parking lots with different settings that connect to each other. One challenge of automatically drawing multiple parking lots is to automatically draw the way the aisles in those parking lots connect.

Figure 26:
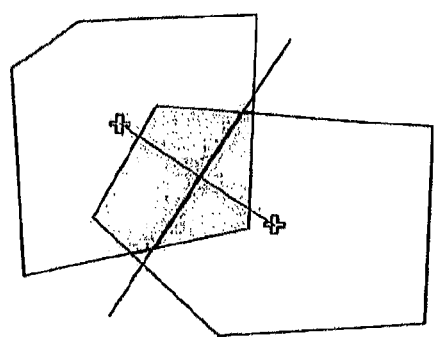
FIG. 26 illustrates two overlapping parking lots, and shows how a new aisle centerline is chosen to separate the two parking lots.

FIG. 26 shows how two parking lots (the dark shaded area) overlap and how a new aisle centerline is chosen to separate the two parking lots. The exemplary "centerline algorithm" may function as follows:

1. If the smaller parking lot is entirely inside of the bigger parking lot, no parking lots are cut. Instead the parking of the small one is generated normally, while the parking in the bigger parking lot uses the smaller parking lot as a 'parking easement' (an area that keeps the parking out) and the conflict is resolved (no point in going to Step 2).

2. First, the center points of both areas are calculated. One way to accomplish this is to average the X and the Y coordinates separately for all points along the outside of the area. An alternative way to it is to calculate the bounding box (the smallest rectangle orientated with the screen that still contains the entire area) and take the center point of that. Adding or removing points in a straight line on the area therefore does not cause the center to shift (like it would do with the average method). Either way works for the algorithm and gives similar results.

Figure 27:
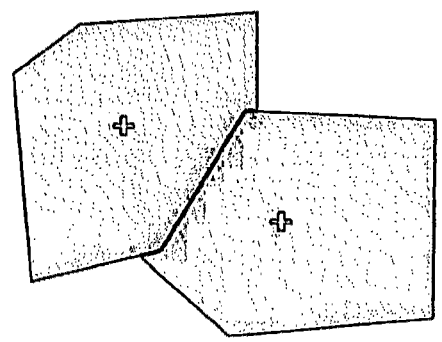
FIG. 27 further illustrates the processing of overlapping parking lots.

3. The next step is to connect these center points with a straight line, called a "connection-line". Then the 'normal' (90 degrees) of that line is drawn exactly halfway of the connection-line. This divider line is used to cut both areas. See FIG. 27.

4. Because only the overlapping area of the two conflicting parking areas needs to be resolved, it is only the overlapping area that is to be cut; everything outside of the overlapping area remain. Inside the overlapping area, a parking area keeps only the area at its own side of the divider line. After removing the excess on both ends, the overlap is resolved and the parking lots can be generated normally.

Figure 28:
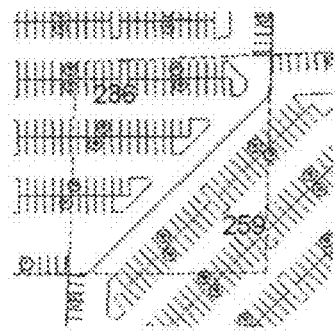
FIG. 28 illustrates overlapping with two fully generated parking lots.

5. For the settings along the entire area divider line and on sides that touch the other parking area, no parking will be generated and the aisle width will be half of what it was to create a normal sized aisle in the connection of the two parking lots. FIG. 28 shows what this overlap looks like with two fully generated parking lots.

Note that this centerline algorithm works on two parking lots, but can be iteratively applied to more than two. When more than two parking lots overlap, the parking lots are sorted on size (largest first) at the beginning of the algorithm. Each pair of parking lots is first checked for an overlap and if one exists, the overlap is resolved immediately. This means that all the pairs of parking lots that include the largest parking lot are resolved first, then all the pairs including the second largest are resolved, and so forth. The order of the parking lots is determined at the beginning of the algorithm so that even though the parking lots change size, the order does not.

B. Parking Lot Resize

In some cases, a user is uncertain of the parking lot layout but does know the number of parking spaces that is required on the site. The user can use the interactive abilities of the an Auto Draw functionality to move the points of the desired parking lot area around to resize the parking lot and slowly get the desired number of parking spaces. That, however, can still be a slow process and might give the parking lot an entirely different shape. The present System attempts to automate that process.

Using an iterative algorithm, this exemplary System makes it possible to automatically resize a user defined shape of a parking lot so that after a short optimization it contains an given number of parking spaces, but has retained its size.

The exemplary "resize algorithm" to resize a parking lot may be implemented as follows:
1. Draws a 'desired parking area' and a desired number of spaces (=desired spaces).
2. Draw the parking spaces inside the current desired parking lot area.
3. Count the number of spaces. (=spaces)
4. Measure the exact 2D size of the desired parking lot area. (=size)
5. Given the desired number of parking spaces (=desired spaces) and the current spaces to size ratio calculate the desired size as follows: desired size=size*desired spaces/spaces
6. Increase or decrease the desired parking lot area with a reasonable step towards the desired size
7. goto Step 2 above.

Increasing the size of an area (Step 6) to an exact target size can be done by moving the points on the desired parking lot area away from the center of the parking lot in a way that is both relative to their existing distance to this center and their individual distances. Given that point p is currently 'distance away' from the center of an area, then in order to make an area exactly of a desired size this point should be:

desired distance=distance*sqrt(desired size/size)

Where 'sqrt(x)' represents the square root of x.
All the points in the outside boundary of the parking lot can now be moved away from the center using a simple directional-relationship as follows:
1. Calculate the current distance of point from center using its x and y coordinates.

distance$X$=point$X$–center$X$ distance$Y$=point$Y$–center$Y$ distance=sqrt(distance$X^2$+distance$Y^2$)

2. Calculate the new location of point using the old distance.

point$X$=center$X$+desired distance×distance$X$/distance point$Y$=center$Y$+desired distance×distance$Y$/distance
point.move(point$X$,point$Y$)

Figure 29:
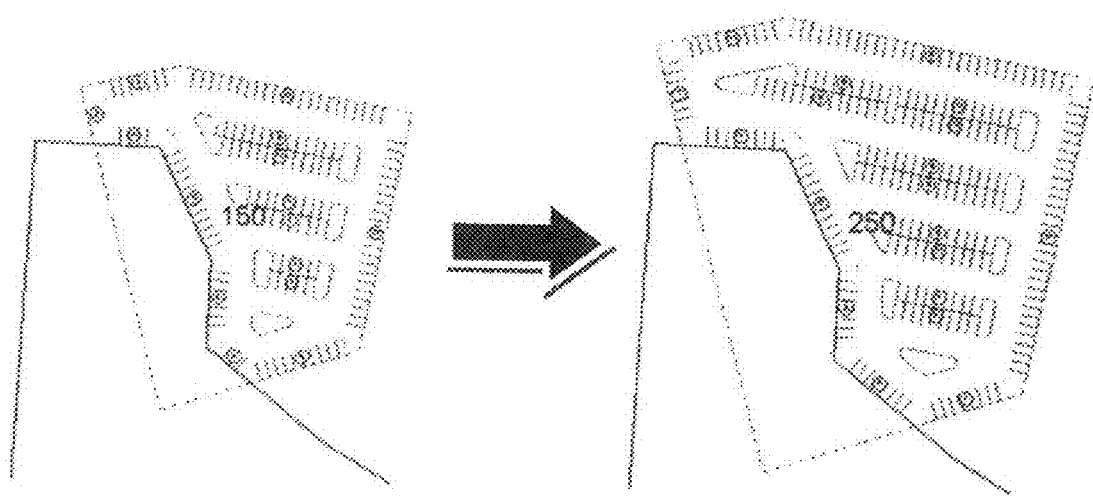
FIG. 29 illustrates an exemplary parking lot with independent designs for both 150 and 250 parking spaces.

FIG. 29 is an example of two parking lots in the same location with the same shape—one with 150 parking spaces and the other with 250 parking spaces.

The present resize algorithm is highly interactive in that it only modifies the size of the 'desired parking area', making it possible for this area to be manipulated while the algorithm is running by either the user or other algorithms. Because each iteration is executed independently from the previous or the next, points can be added, removed or moved and the entire area can even be rotated while the resizing is going on, making this algorithm dynamic and robust.

C. Parking on Arcs

Although one objective of the Auto Draw feature is to provide a conceptual drawing of the site layout in order to make project and design decisions sooner, the part of a site that has an impact on those decision can be small and filled with details. One of those details that can have a significant impact is 'parking on arcs' (or rounded corners). Not only can this be aesthetically pleasing, but it can also impact the number of possible parking spaces and the shape of aisles and islands surrounding those spaces.

Automatically drawing parking spaces with a given width and depth is a substantial accomplishment, especially if this is achieved in a real-time dynamic drawing tool. The present System goes beyond this to account for the possibility of parking around arcs.

A primary difference between a normal parking space and a parking space on an arc is the definition of the width of that space. This width should be defined at the smallest part of the parking space (as necessary for parking cars) increasing the total surface of the space in the process. This has an immediate effect on how to draw and count the parking space, but is also important in the sizing of the full length of the row of parking to an exact number of parking spaces.

The present System utilizes an "arc parking algorithm" that measures in what direction the arc is going, calculates the separation needed between the lines to still achieve a legal parking space, and then draws the lines in the right direction—all while maintaining the constraint that only whole spaces are drawn. Moving points or lines on the boundary of the parking lot instantly triggers redraws on these parking spaces and recalculations of the surface and parking count.

Figure 30:
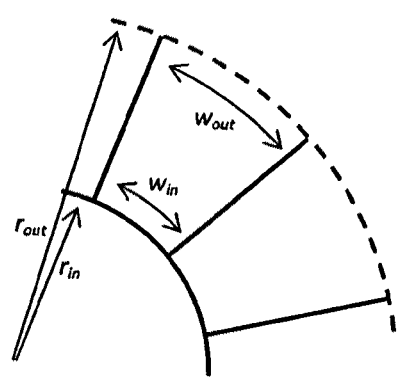
FIG. 30 illustrates application of an exemplary arc parking algorithm.

Referring to FIG. 30, the arc parking algorithm may be implemented as follows:
1. When parking goes around an arc, the width on the outside of a parking space gets stretched out. ($w_{out}$>$w_{in}$—where the width is measured along the arc)
2. In order for a car to be able to park in the space, the minimum-width (in this case $w_{in}$) needs to be equal to the parking width.
3. If the arc would bend the opposite direction the other side of the parking space would have to be identical to the parking width. Thus, the length of a row of parking is defined by the length of the 'inner lengths' of the parking spaces in that row.
4. In order to calculate a usable 'length' this inner length is calculated along the entire length of the row of parking. Note that this can include multiple arcs bending in different directions and multiple straight lines as well. The inner length of a row of parking is defined as 'the sum of all the inner lengths of all the parking sections in the row'.
5. Once the inner length is calculated, this length can be used to determine exactly how many parking spaces will fit in this row of parking and how much the row needs to be shortened to fit exactly that many (for all these inner length calculations are used).

Note that the length of $W_{in}$ and $W_{out}$ relate to $r_{in}$ and $r_{out}$ in the following way:

$W_{in}/r_{in}=W_{out}/r_{out}$

This means that:

if $r_{out}$>$r_{in}$: $W_{in}$=width and $W_{out}=W_{in} \times r_{out}/r_{in}$ else: $W_{out}$=width and $W_{in}=W_{out} \times r_{in}/r_{out}$ (where width is the width requirement of a single parking space defined by the user)

And seeing that $r_{in}$ and $r_{out}$ are exactly length apart, where length is the length requirement of a single parking space defined by the user, the following simplification can be used:

if 'arcing inside': $W_{in}$=width and $W_{out}$=width×($r_{in}$+length)/$r_{in}$ else: $W_{out}$=width and $W_{in}$=width×$r_{in}$/($r_{in}$−length)

This calculation not only applies to a single parking space, but also works for entire arcs and straight line pieces. Thus, in order to calculate exactly how many parking spaces fit on a line that includes arcs, you do the following:

If the 'inside length' of a line is defined as 'the length of the line on the short side of the parking space', then the following "spaces-on-a-line algorithm" calculates the number of parking spaces on a line:

1. Split the line at points where the parking is not able to continue. This can be due to many reasons, but the most common are:
   a. The parking settings on the outside line on the parking lot dictate that a different parking setting needs to be started at point. (e.g., a different parking length)
   b. The parking settings on the outside line on the parking lot dictate that there is no parking allowed on only one side of the parking.
   c. The lines connecting the point make a sharp corner with no arc or an arc radius that is too small to allow for a parking space.
2. After the line is split in multiple pieces, those pieces are taken one by one and split up again, but this time in a list of line pieces and arcs. The line is split up everywhere the center point of the line is changing or the direction of the line is changing.
3. Using the parking length specified by the user, for each of those line pieces and arcs the front length is calculated, taking into account the length of the line pieces and the direction the arcs are 'bending' in.
4. The total 'inside length' of each line (coming out of Step 1) can now be converted in a parking space count by: parking spaces=floor (inside length/parking width), where the floor(x) is the nearest integer to x number rounded down.

Note that this approach even works in cases where the parking is angled at less than 90 degrees.

Figure 31:
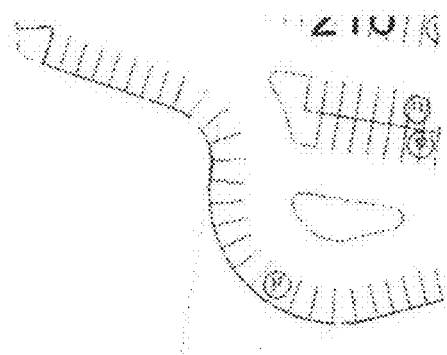
FIG. 31 illustrates parking on an arc, as drawn by an exemplary Auto Draw feature.

FIG. 31 shows what parking on an arc looks like as drawn by the Auto Draw feature.

D. Parking Direction Line

The present System may further control the direction of parking bays inside of a parking lot using a 'Parking Direction Line'. Every parking lot can have its own direction line and each line can consist of multiple line pieces. The user can select a parking lot and draw a direction line on that parking lot after clicking on a corresponding menu item. This gives the user the opportunity to do things like (a) line up a row in the parking center to a driveway coming into the parking lot, (b) direct the parking perpendicular to a retail building to allow people easy access to that building, and because the parking direction can have multiple line pieces, (c) design parking going around a corner of a building or site.

As discussed previously, the location of the parking bays and the aisle between them is dictated by an algorithm that takes one side of the parking center and offsets it first by twice the depth of the parking and then by the width of center aisle until the center is fully split up into bays. This present algorithm improves on that by offsetting a parking direction line with multiple pieces instead of only one line of the parking center.

The distances that the line is offset is also somewhat different. The parking direction line is drawn in the middle of a center aisle, which means that the line needs to be offset half a center aisle width before it is offset twice the parking depth and then the center aisle width over and over again.

Figure 32:
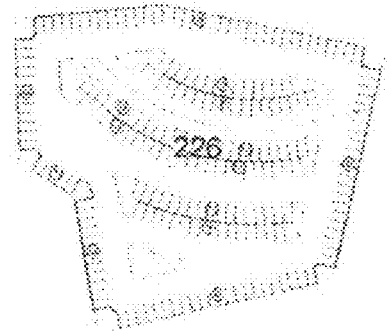
FIG. 32 illustrates one example of a direction line inside an automatically drawn parking lot.

FIG. 32 shows an example of a direction line (dashed line) inside an automatically draw parking lot. Note that in this case the direction line contains an arc. The direction line can be moved, instantly updating the parking bays and all the parking spaces in them. This then updates all the counts, and might have resizing effects on the entire parking lot if it has a desired parking count set—a very dynamic way to control direction of bays in a parking lot.

E. Parking Accessibility

One challenge in automatically drawing parking spaces is that in some cases the user draws an area in which it is impossible to draw legal parking spaces that adhere to all the constraints defined by that user. At this point, the System could choose to remove these parking spaces and not show any infeasible ones, but then it is difficult for a user to understand what is going on and why some parking spaces are not drawn.

This present System automatically shows the accessibility and therefore feasibility of parking spaces. It uses the entrance of each parking space and the width of the aisle to calculate where a car would need to enter that parking space, and whether that would be possible or not. Each impossible/infeasible parking space gets marked as such, and this is shown to the user using dots. The user has the option to ignore these warnings by toggling a parameter on each line in the drawing. Only feasible parking spaces are counted towards the total, but the pavement area for each infeasible space is calculated into the cost.

Figure 33:
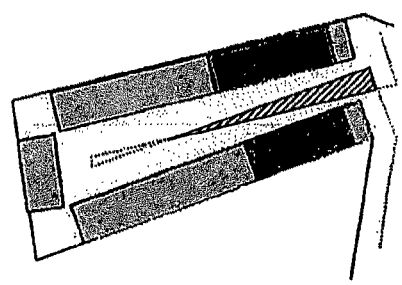
FIG. 33 illustrates the formation of an offset from an inside of the parking spaces.

The present "space accessibility algorithm" used to determine if a space is accessible by a car may be implemented as follows:

1. Referring to FIG. 33, after all the parking spaces are generated, an offset is created from the inside of the parking spaces with exactly half the aisle width of each side. (Note that this can be different for each side of the parking lot)
2. The offset is cut with itself and the areas that are NOT overlapping are remembered. Note that where the offset intersects itself there is no space to generate an aisle with the right width.
3. Then for each and every parking space the closest accessible area is found and if that area is close enough to the parking space than the parking space is deemed accessible. All other spaces are marked as infeasible with a dot.

Figure 34:
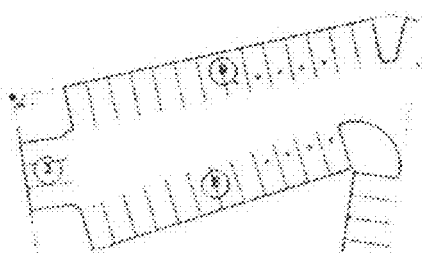
FIG. 34 illustrates inaccessible parking spaces marked with dots.

In FIG. 34, for example, the parking spaces marked with dots are not accessible because the aisle width constraint of 25 feet is not met. Each infeasible space is subtracted from the individual parking bays having a direct effect on the total parking number. Because this feasibility calculation is part of the dynamic iterative loop, all feasibilities are recalculated every time any point in the parking lot is moved or when constraints in the parking lot (like width/depth) are altered.

F. Custom Parking Space Sizes

In order to accommodate for special parking spaces such as 'handicap parking', 'contractor parking' and 'compact parking', a "special parking algorithm" was developed to allow the user the ability to give custom sizes and counts of parking spaces that deviate from the default settings in the parking lot. The input for this algorithm is stored in so called 'parking points'. In earlier algorithms, special parking spaces were defined by a count and a ratio to that count, meaning that two handicap parking spaces would replace three normal spaces, such that the special spaces would precisely lineup and fit within the normal spaces. However, this made it practically unfeasible to generate parking spaces with widths that would not precisely line up.

The present special parking algorithm addresses this problem by adding the parking spaces in the bays during the assignment of the parking spaces, as opposed to afterwards replacing spaces with a specific ratio. This makes it possible to adjust islands and curbs accordingly.

The exemplary special parking algorithm works by generating all the custom parking spaces before the normal spaces are generated. The normal parking spaces cannot occupy the same space as the custom parking spaces, so the total parking width that is possible in the bay is adjusted while (just before) the normal parking spaces are generated.

$$\text{number of normal parking} = \text{ParkingWidth} * \text{floor}((w - \text{TotalCustomParkingWidth})/\text{ParkingWidth})$$

where the TotalCustomParkingWidth is the total parking width needed to accommodate all-the-custom parking-spaces needed in one row of parking as defined by the parking points. Now that the number of parking spaced is calculated, the means for generating the parking spaces and island is unchanged from the means previously described above.

G. Custom Islands

At times, a user may wish to dictate exactly where the islands should be located in the conceptual design of the parking lot. This is, for instance, important for purposes of determining the number and possible location of trees on the site, which impact government regulations and aesthetics.

The "custom islands algorithm" of the present System allows for the manipulation of islands inside parking lots. By storing the settings of a custom island in an 'Island Point' a user can move, resize and change the characteristics of the island this point is hovering over. Moving the parking lots would then move the island points as well, and the same goes for moving the buildings that have parking lots assigned to them.

The implementation of Custom Islands in the present algorithm is similar to the implementation of Custom Parking Sizes, but instead of impacting the row of parking that the point is in by changing the effective parking width, an Island point splits a row of parking into two rows. For each island point the custom island algorithm does the following:
1. Find the nearest row of parking to the island point.
2. Find the closest point on the row of parking to the island point.
3. Split the row of parking into two rows.
4. Make each row exactly half the island width smaller around the island.

This is done right before the parking rows get assigned parking spaces, so even before the Custom Parking Spaces get assigned.

Figure 35:
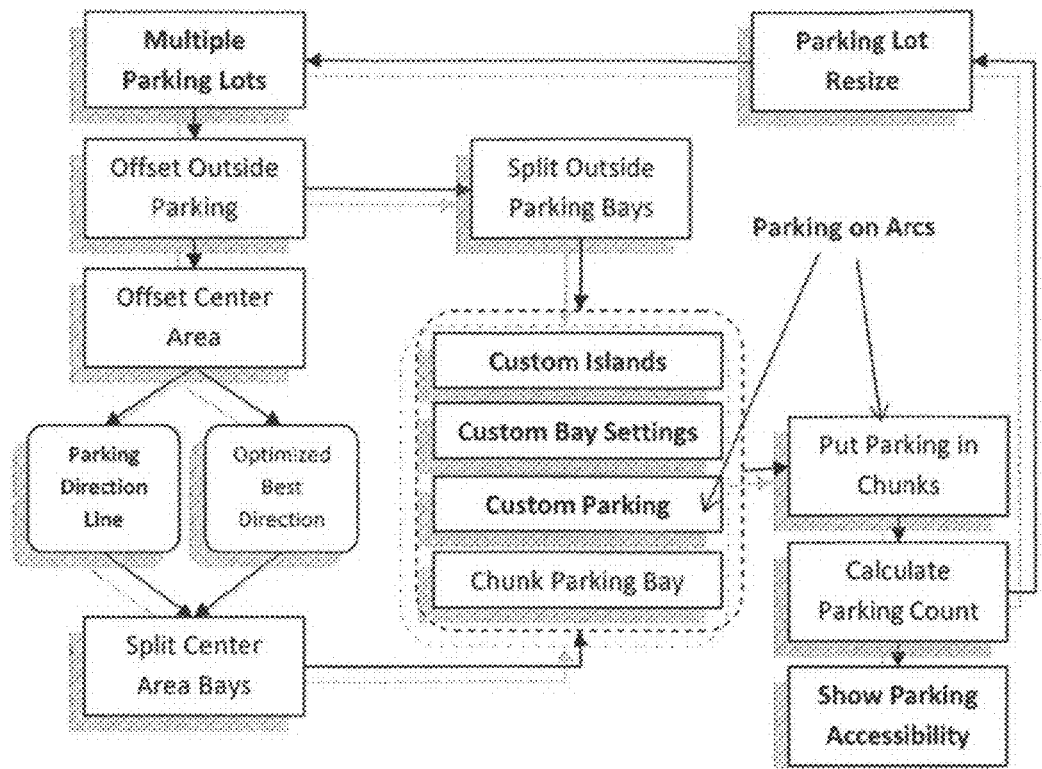
FIG. 35 illustrates the relation of separate steps in an exemplary algorithm for automatically drawing parking spaces.

FIG. 35 shows the relationship of all the separate steps in the exemplary algorithms discussed above for drawing parking spaces automatically.

H. Dynamic Transitions within and Surrounding Parking Lot

Roads, streets and driveways are generally defined in Civil Engineering using a 'center line' and one or two 'offsets'. The centerline of a road is then often the exact center of the road or (more commonly) the line that separates the two directions of traffic. Switching from one width to another width in the same drive is called a 'transition'. This transition is done gradually to accommodate for the correct curbing and travel lanes. One objective of this System is to define a transition in such a way that it is flexible and powerful enough to describe most feasible road transitions, but simple enough to use in a realtime conceptual site design software product.

Figure 36:
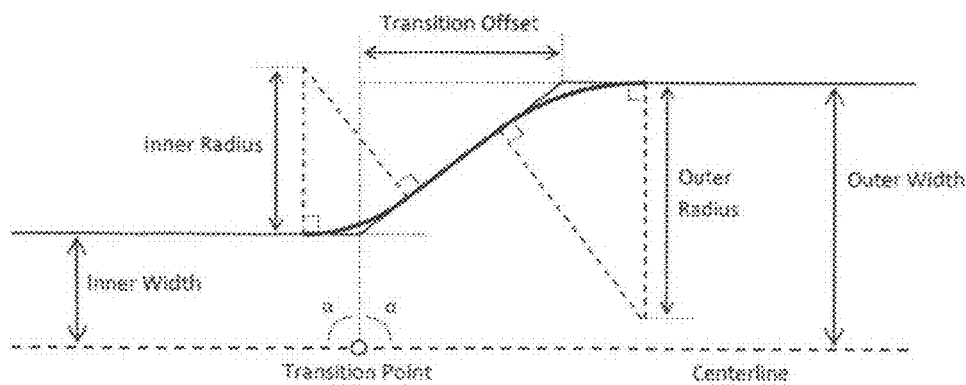
FIG. 36 illustrates exemplary settings for dynamic transitions within and surrounding parking lot.

Referring to FIG. 36, the exemplary definition consist of three settings: a 'Transition Offset', an 'Inner Radius' and an 'Outer Radius'. These settings are all stored in the 'Transition Point' which is connecting two line pieces (or 'sides') on the centerline that have different drive offset widths. The 'Inner Width' is the smaller width of the two connected sides, while the 'Outer Width' is the larger one.

The transition is then defined by first defining a Transition Line that goes from the Inner Offset to the Outer Offset. The Transition Line starts where the Inner Offset intersects with the line from the Transition Point in the direction where it has equal angles ($\alpha$) to both sides, and it ends the Transition Offset away from where the Outer Offset intersects that same directional line originating from the Transition Point. Note that this definition also works if the centerline is bent, and even if the road has an arc in it. In that case, the Transition Point would be halfway of the arc connecting the two sides of the Centerline, and the Transition Offset would be measured 'along' the Outer Offset going with the arc.

To complete the transition, two arcs are added to the offset line—one from the Inner Offset to the Transition Line defined by the Inner Radius, and one from the Transition Line to the Outer Offset using the Outer Radius. Here, the inner arc is calculated first so that if the outer arc is unable to fit on the Transition Line it will start on the inner arc instead.

Note that in FIG. 36a transition is shown on a straight line for simplicity reasons only. The definition above also works on centerlines consisting of multiple arcs, spirals, splines or any other line type that can be successfully offset to form the two different width offsets (Inner and Outer). Also note that this definition of a transition makes it possible to have two independent transitions on a drive, one on either side of the drive.

Figure 37:
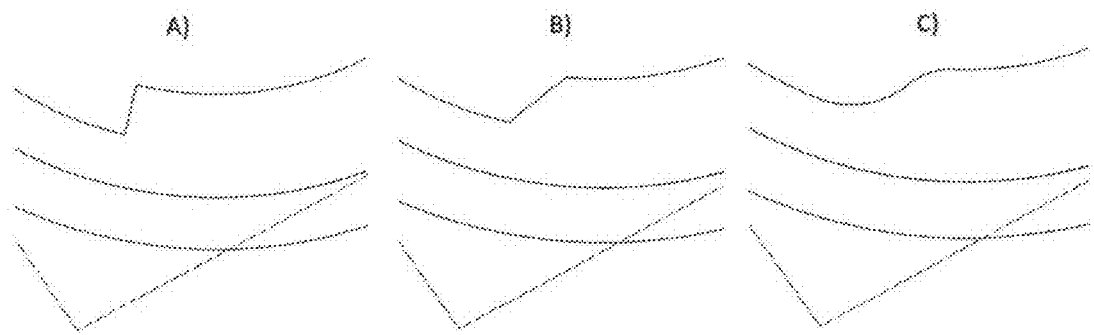
FIG. 37 illustrates an example of a transition applied to a road with arcs.

FIG. 37 shows an example of the transition (as defined above) applied to a road with a road consisting of arcs (in this case only one). In this drawing at A) just the inner and outer offsets are applied. At B), the transition offset is applied along the top arc. At C), the inner and outer radiuses are applied (20 and 15).

This definition makes it possible to generate a powerful and accurate road transition that is sufficiently dynamic to be used in real time Auto Draw functionality.

I. Context Sensitive Pathways within and Surrounding Parking Lot

The present System provides means to automatically draw different forms of pedestrian pathways depending on the context in which these paths are drawn. In normal standard CAD software it is generally difficult and time consuming to draw sidewalks, curbs, crosswalks and all the mandatory ramps and constraint slopes, not to mention the time and effort it takes to modify the design.

In the present exemplary System, the different contexts in which pedestrian pathways can be defined include:
1. Within landscaped areas.
2. Along the side of drives or roads.
3. Crossing drives or roads.
4. Intersecting other pedestrian pathways.

Figure 38:
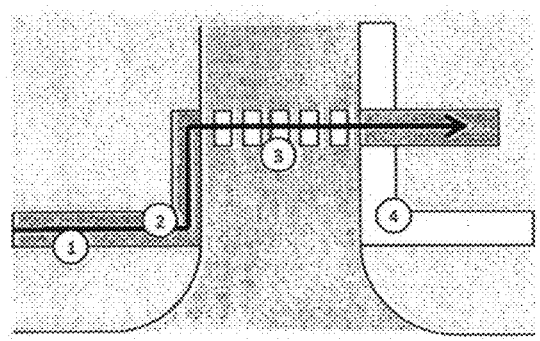
FIG. 38 illustrates the generation of different grading/drainage constraints.

Referring to FIG. 38, for each of the above contexts, the System will generate different grading/drainage constraints:
1. For a sidewalk going through landscape area, there will be a slight cross slope from the centerline of the sidewalk to the edges of the sidewalk so that the water is readily drained into the landscape area, and there will not be a curb.
2. For a sidewalk on the edge of drives, the offset will be calculated from the edge of the drive, not from the centerline of the sidewalk. By default there will be a curb on the side of the drive and the water will drain towards the drive.

3. When crossing a road or drive, the sidewalk will by default try to lower so as to not have curbs crossing the pathway (when entering and leaving a road/drive). A crosswalk will then be drawn on the pavement (if possible) and additional slope requirements can be assigned to the pavement area.
4. When two pedestrian pathways are crossing by default, the surface thickness will increase slightly to accommodate the additional traffic. The slope directions will also need to be combined. If there are any conflicts, the pathway along a road/drive wins.

Most of these constraints can be generated using the centerline of the sidewalk, but some (like the additional slope constraint on a cross walk) may have to generate an additional area and associate that area with the centerline so that when the user changes anything in data structure of the pathway, the additional area can be removed.

B. Grading Solver

Although the grading solver can be used by the layout solver as part of the fitness function, the grading solver can be considered an optimization on its own. It optimizes the earthwork on a site given certain slope and height constraints. Running the grading solver by itself gives a quick indication of the earth cut and earth fill costs of the supplied layout. In this scenario, users enter grading constraints such as minimum parking lot slope, maximum parking lot slope, maximum retaining wall height, and the like. When performing this optimization, the system considers raising/lowering the overall grade of the land, where to place retaining walls, where curbs need to be located, appropriate slope for parking, and other relevant grading issues. The grading solver then considers the different areas specified in the layout, reads in the user-defined grading constraints, and cost optimizes the grading plan for the site.

Input:
A complete layout
A three dimensional existing grade
Grading constraints for the layout
Separate unit costs for grading (excavating/filling) the site
Output:
A three dimensional proposed grade
A cost report for the proposed grade (excluding utility costs)

Figure 39:
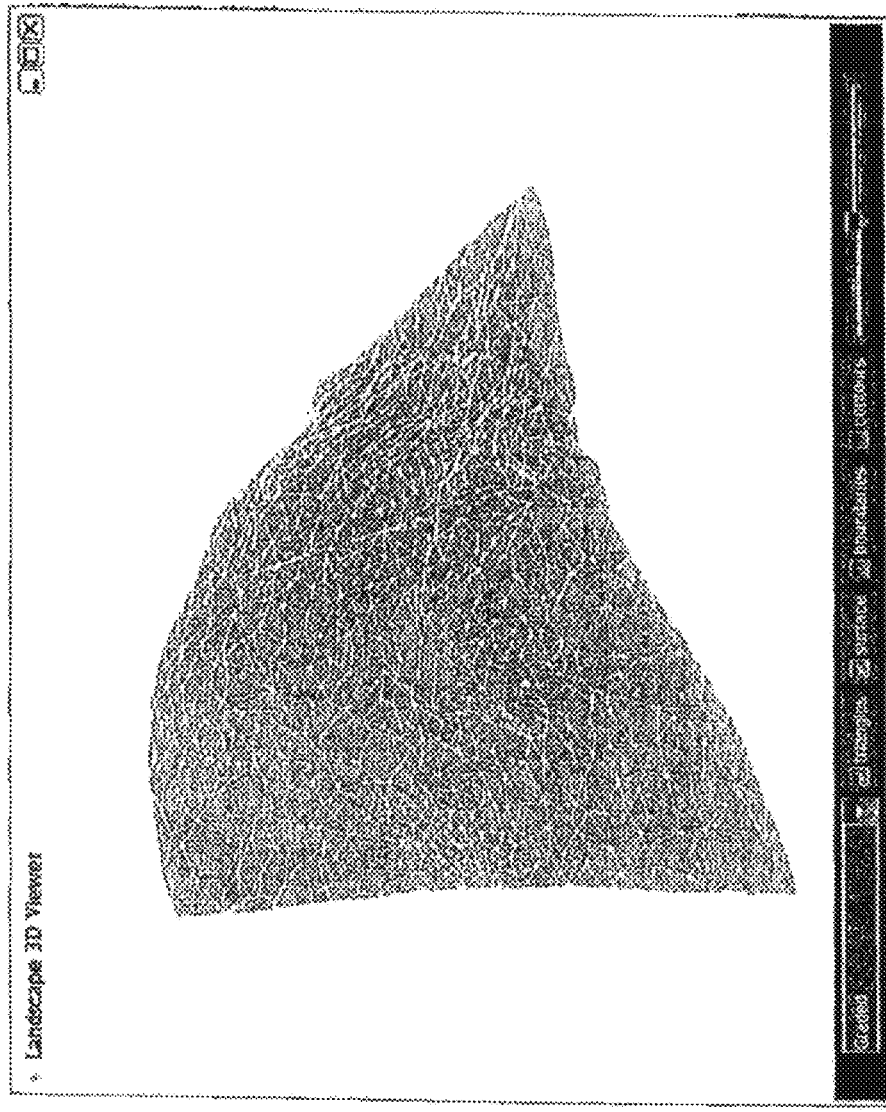
FIGS. 39 and 40 illustrate before and after images demonstrating operation of an exemplary three-dimensional grading simulation tool.
Figure 40:

Users running this quick solver through the web interface are provided a three dimensional grading viewer that allows them to watch the site actively being graded. FIGS. 39 and 40 show before and after images demonstrating operation of the 3D grading simulation tool. This tool visually illustrates the earth which is cut/filled, any excavated rock, where retaining walls are placed, where curbs are built, where drives are run, and other details.

Grading options considered by the system can be customized by the user. User can enter rules into the system that direct the grading of the site. Such rules include, for example:
Specifying maximum retaining wall height
Indicating minimum and maximum slopes allowed for parking areas To further optimize the grading plan, the grading solver and utility solver may be run in a stacked scenario so that grading considers drainage issues in its optimized solution.

The optimization process of the grading solver is discussed below.

Grade Optimization

A 'grade' can be defined as a 'surface' and all its retaining walls. To make it possible to optimize a grade, the following assumption are made in respect to the data structure:

retaining walls are only situated around a two dimensional area
a surface consists of a triangle mesh
every point (except for those on retaining walls) have only one surface elevation Retaining walls are usually situated around the parking lot, and any exception can be handled by splitting the area where the retaining wall needs to go. Defining a surface using a triangle mesh is commonly used in civil engineering and such a surface is generally known as a TIN. And finally, the third point makes overhanging balcony shapes unfeasible for the ground surface.

Because retaining wall are defined to be located on boundaries of two dimensional areas, a retaining wall between area A and B can be defined by two rows of three dimensional points. One located in area A and one located in area B, both having the same two dimensional locations, but different elevations. The difference in elevation then creates the vertical wall. This ensures that inside an area there is only one elevation at a given location, and that makes it possible to define the surface inside an area as a set of three dimensional points, where the first two dimensions give the location of the point and the third dimension is the elevation of the surface at that location. Using a smart triangulation algorithm; these points are then connected with triangles to generate the surface. The retaining walls link the separate areas together to form the finished three dimensional surface structure.

The exemplary grading solver optimizes the surface shape such that the grading constraints are met and the cost is minimized. Most grading constraints are defined on the two dimensional areas either given by the layout solver or inputted by the user. A parking lot, for example, usually is not allowed to slope more than 4 degrees in any direction to prevent cars from rolling, but should at least slope 2 degrees to facilitate water run-off. In addition to the minimum and maximum slope, there are several other constraints that impact the grade, the most important of which may be the minimum and maximum elevations to prevent the grading of a certain area below or above a specified height. Important to note is that the optimization process, as outlined below, is independent of the individual constraints, which makes adding new constraints easily possible.

Vast Search Space

After the surface is constructed using all the two dimensional areas and the existing grade supplied by the user, this structure remains essentially the same. The grading solver changes the elevation of all the three dimensional points. By moving a point up or down, all the triangles connecting to the point will get a different slope. If the point is moved down, the triangles will slope more towards the point, and if it is moved up they will slope more away. This means that there are many different surfaces with different slopes and elevations with different costs possible. Consider that there is no 'smallest change' defined, which means that there is an infinite number of possible elevations for every single point in the surface:

The points that define the existing surface for the grading solver come from either contour lines or survey points that the user inputs using desired methods. To accurately input an average sized surface takes about 5000 points. Some detailed surfaces can require up to 10000 points. Every one of those points can be changed independently. That makes this a very high-dimensional problem. To illustrated the immensity of this search space, one can think of what would happen if every point in the surface could have 10 different heights. This would give (on average) $10^{5000}$ different surfaces (1 with 5000 zeros). To compare, the number of atoms in the universe is estimated at $10^{81}$ (1 with 81 zeros). That means that not only is the search space too vast to go through all possible answers, it is so big it becomes difficult to optimize in it.

Local Optimization

Even though the search space is huge, there are two main characteristics in the exemplary System that make optimizing a grade feasible:

Changing a point in a graded surface is only impacting the surrounding triangles and connecting retaining walls, it does not change properties on the other end of the site.

The existing grade (although probably infeasible) is the cheapest grade to generate. No earth needs to be moved and no retaining walls need to be build. It is free. The cost of the earthwork is largely linear to the distance between the proposed grade and the existing one.

These two points give rise to the following assumptions:

If a triangle is sloped too much towards a certain point, moving that point upwards makes the site more feasible.

If a triangle is sloped too much away from a certain point, moving the point downwards make the site move feasible.

Moving a point towards its original elevation makes the site cheaper if it decreases the difference between the total cut and total fill on the site.

Moving a point in a retaining wall towards its counterpart, reducing the size of the wall, makes the site cheaper.

Move a point in the direction of 'the global need' saves cost, where 'the global need' is defined as 'what the rest of the site could use now'. So if the site is currently importing earth then a point can help by moving down, while the opposite is true for a point moving up when the site is currently exporting earth.

In view of the above, the global optimization that was presumably too difficult to solve, is now defined in terms of a local optimization which may be substantially easier to solve. It is a small step to take these rules and apply them in the form of a deterministic local optimization by adding the following assumption—all points can be changed at the same time without changing any assumption listed above.

This type of optimization is used in Cellular Automata (CA) and is called 'synchronous updating'. The present approach is comparable to a CA in that there is a neighborhood, and the points are influenced by their neighbors by elevation changes in the previous generation. The surface structure however is different, and global influences such as the total cut and fill balance is also unique, as is the application to earthwork calculations in civil engineering.

Figure 41:
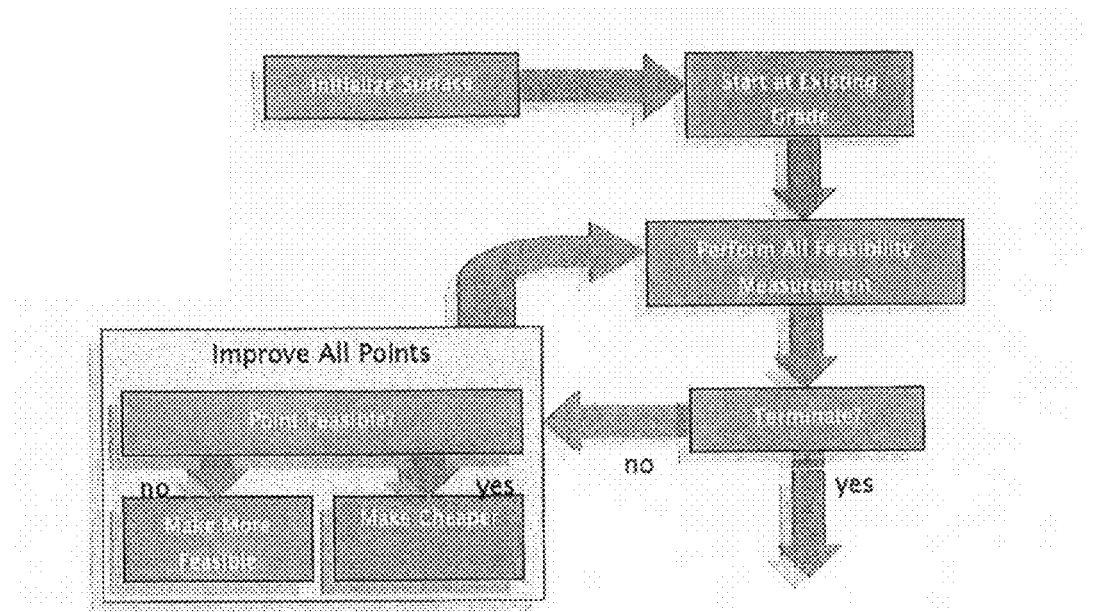
FIG. 41 illustrates the exemplary grading optimizer.

FIG. 41 demonstrates this optimization process. Please note that the feasibility and cost calculations are here abstracted for the purpose of explanation.

Termination

The grading solver terminates when the surface is feasible and the cost optimal. Two problems with this. First, it is important to note that there can be site with grading constraints that are infeasible to implement on a site. The combined areas can have slope restrictions that are just not doable on a certain existing grade for instance. Second, the grading solver has no way of knowing if the cost of the site is optimal. Because of this, why the grading solver assumes the following:

If the cost of the entire grade has not changed more than 0.5% in the last 1000 iterations, the cost is optimal.

If the feasibility of the site has not changed more than 0.5% in the last 1000 iterations, this is as good as the feasibility gets. If this is infeasible, the site constraints cannot be implemented.

While this may not hold true for every site, in practice these settings work well on at least 98% percent of the sites. The settings can of course be changed if a higher quality is needed, but this will impact the run time of the algorithm.

The grading solver seeks to optimize the proposed surface of a site in such a way that the cost of the total site is minimized. This is done with an evolutionary approach that uses local heuristics to change the proposed surface.

A surface in the present system is defined with triangles. These triangles are generated using a combination of 'Delauney Triangulation' and the 'shaping' of boundaries. The following statements are important to note about the resulting data structure:

Every point has a list of connecting triangles

Every triangle has three different points

Every point has an current and original elevation

Some points are 'linked' to other points above or below to form walls

The grading solver can be run stand-alone or in combination with the utility solver. If the grading solver is run in combination with the utility solver, it seeks to minimize inlets and raises and lowers ponds and unreachable inlets to make the drainage feasible and less expensive.

How the grading solver optimizes a grade, and details regarding the determination of feasibility and cost are discussed further below.

(i) Feasibility

There are many feasibility constraints that need to be enforced in order to get a feasible grading solution. These constraints must be translated to attributes of points. There are two different types of grading constraints:

Slope constraints

Height constraints

Slope constraints are constraining the slope of a triangle between a minimum and a maximum slope. This is generally defined for entire areas, but could also be defined for virtual areas defined by offsets on sides or points. Important slope considerations include:

Slope of an entire area.

Slope away from the building.

Slope inside a building in a certain direction.

Slope on a curb.

To enforce a slope constraint, the triangle that violates the constraints needs to be tilted or leveled. This can be translated into changes on points by moving the points away from the average elevation in case of tilting, and closer to the average elevation in case of leveling.

Height constraints are also generally defined on entire areas, but can be dynamic in nature. Accordingly, a minimum or a maximum slope can be dependent on the height of another area or point. This makes defining the different parts of a pond possible, for instance.

Because of the dynamic nature of some of the height constraints, the points that violate a minimum or maximum constraint are not move directly to that specific constraint, but rather slowly towards the constraint.

One particular height constraint is the maximum retaining wall height. This in fact is the maximum elevation difference between two linked points.

(ii) Cost

One primary objective of the grading solver is to optimize for cost. However, resulting solutions are only relevant if they are also feasible. As such, regardless of the cost of a certain change, if it improves feasibility it will be done. Every point keeps track of a feasibility improvement and a cost improvement. Only if the feasibility improvement is close enough to zero, the cost improvement is applied as well.

Altering the elevation of a single point affects the cost a number of ways, including:
Cut/fill of earth and rock.
Exporting/importing earth.
Disturbed earth.
Height of retaining walls.
Number of inlets.

Some of the items mentioned above can be calculated locally and others must be dealt with in a global way for each iteration. Every iteration the cost calculation proceeds generally as follows:
Calculate total export and import
Calculate number of inlets
...
For every point do:
...
if point feasible do:
Calculate impact of change on earth and rock cut
Calculate impact of change on disturbed earth
Calculate impact on optional retaining wall
Calculate direction for balancing import/export
Calculate whether inlet should be removed
...
For every point do:
Change point (iii) Feedback Loop from Drainage One possible drawback of using a local search algorithm and relying heavily on the local directional heuristics is that a direction is required on every aspect of the optimization. The problem is that drainage is hard to define in terms of local properties. The number and size of the inlets might give some feedback, but the height of the pond for instance is not as easily defined.

At present, the height of the ponds is defined as the average of the area in which it is defined. This is tried for around 500 iterations of the grading solver, and then 1 drainage iteration is done. The result of the utility/drainage solver is then seen as the optimum given this pond height. Then, the pond height is changed (mutated) and the grading is run for another 500 iterations with another single run of the utility solver. If the result is improved, the new height is used for the next mutation else the old one is used. This process is very similar to a (1+1) evolutionary strategy (ES).

Multiple Expansion and Compaction Coefficients

When earth is cut from the ground it mixes with air and expands in volume, and when earth is put into the ground for building purposes it compacts slightly in volume due to this same air being compressed out. This process is referred to as 'expansion' and 'compaction' respectively. In order to calculate the correct cost for a site, expansion and compaction factors need to be taken into account. Currently available software uses only one expansion and one compaction number to apply to all soils, no matter their type. This is not sufficiently accurate to perform optimization and balancing on the volumes.

Figure 42:
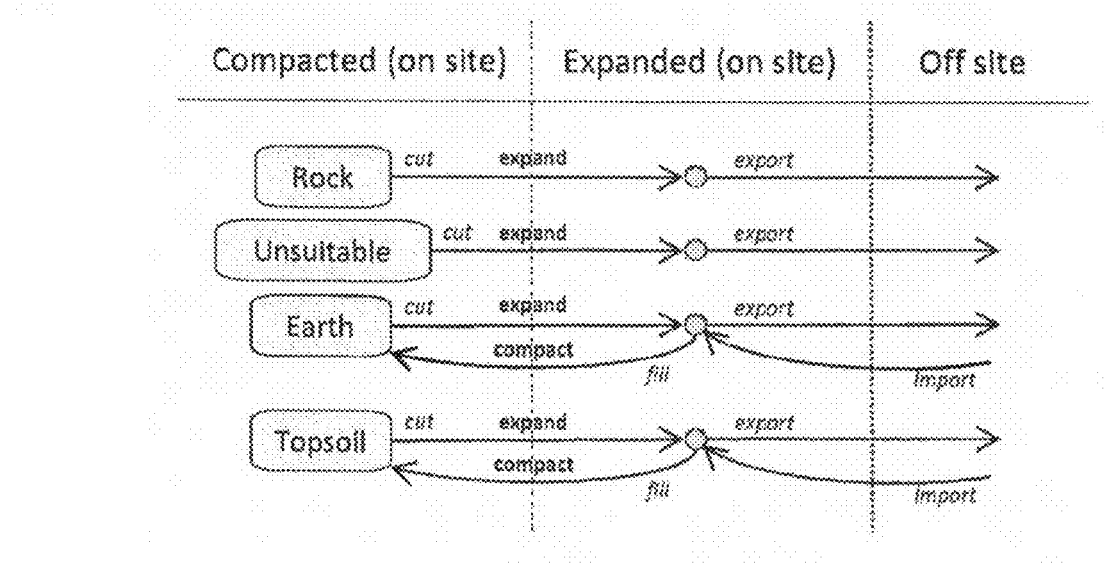
FIG. 42 illustrates an exemplary grading model.

Because of this, the present exemplary System incorporates the model described below and illustrated in FIG. 42.

In the exemplary model, there are four different distinct soil types: (a) rock, (b) unsuitable, (c) earth and (d) topsoil. "Topsoil" is the top layer of organic material that may not be suitable for building but is needed for growing vegetation. "Earth" is the dirt that can be reused in the construction process. "Unsuitable" is the dirt that is not suitable for construction or for vegetation. "Rock" can be anything from buried gravel to bedrock that cannot be reused on the site, and usually requires a higher cost to remove and transport.

Each of the four soil types can expand with their own expansion coefficient when they are cut from the ground. This makes it possible to have rock expand more when cut verses normal earth for instance (something that is very common). Both earth and topsoil can get reused on the site, so they also get a compaction factor which can be independent from the expansion factors of those types.

Note that in this model all the unit costs for calculating the total site cost are using the expanded volumes (even the cut unit costs). This means that balancing a site should consider the expanded volumes as well.

This improvement may impact the grading solver in two ways:
1. The cost in the cost report that is generated by the grading solver is always calculated on the expanded volume.
2. The volumes that are used internally in the grading solver also need to use the expanded volumes.

Desired Import/Export

Importing and exporting soil is generally an expensive undertaking. Because of this, the grading solver often determines that the least expensive solution is to balance the site as closely as possible. The are, however, exceptions to this rule. If a developer is building on two neighboring sites at the same time for instance, then it might be possible to cheaply import an amount of dirt from one site to the other one. The present System affords users a simple way to direct the exemplary grading solver to take this into account.

Two different settings are defined—'desired import' and 'desired export', both with their own unit cost. 'Desired import' defines the volume of earth that should be imported, while the 'desired export' is the volume of earth that should be exported from this site. Although the grading solver will work to get as close as possible to the desired volumes, a feasible site is still the highest priority. This means that if a desired volume of import/export would make a site infeasible, only part of that volume will be imported/exported.

This feature is implemented in the grading solver by adding the desired import/export as an offset to the balancing cost savings 'pull' that is applied to each point. Normally, that pulls the points to a completely balanced site (with most realistic unit cost settings), but by changing the target to the 'desired import/export' value the site will balance to that number without having to add any addition criteria.

Borrow/Fill Area

In order to balance a site, the grading solver cuts and fills on areas of the site that are most cost effective. This may not always be the most aesthetically pleasing or 'correct' according civil engineering rules of thumb. Because of this, the user needs to have more control over where the grading solver cut and fills to balance a site.

The present System uses two area types to allocate areas on a site to cut and/or fill in order to balance the site:
1. Borrow Area. (The user prefers to have the grading solver cut earth from this area first if it needs any to balance the site)
2. Fill Area. (The user prefers to have the grading solver fill earth in this area first if that is needed to balance the site)

Each area also has minimums and maximums that the grading solver will work to adhere to. A Borrow Area has a Minimum/Maximum Borrow volume, and a Fill Area has a Minimum/Maximum Fill volume.

Implementing this in a local optimization algorithm can be done in the following way:
1. By increasing the 'pull' for balancing the site in the points inside of the Borrow/Fill Areas in such a way that the point is pulled down faster if it is inside of a Borrow Area and pulled up faster is it is in a Fill area, the point will react quicker to the balancing effort of the grading solver and will be changed first.
2. By measuring exactly how much earth is cut/filled in a Borrow/Fill Area and comparing that to the Minimum and Maximum setting in the area, a point knows that it needs to go down/up more/less to adhere to the constraints set on the area. The amount it moves towards the constraint can be calculated relatively to the surface of the Borrow/Fill area to increase the speed at while the constraint is met in the iteration process.

Note that this method allows for multiple Borrow and Fill areas on a single site.

C. Utility Solver

The utility solver generates an optimized drainage plan including inlets, outlets, and pipes needed to effectively drain the site. The utility solver will typically be run stacked under the grading solver. The utility solver can also be run by itself in the web interface as a quick solver to provide valuable feedback regarding issues of aesthetics and feasibility.

Figure 43:
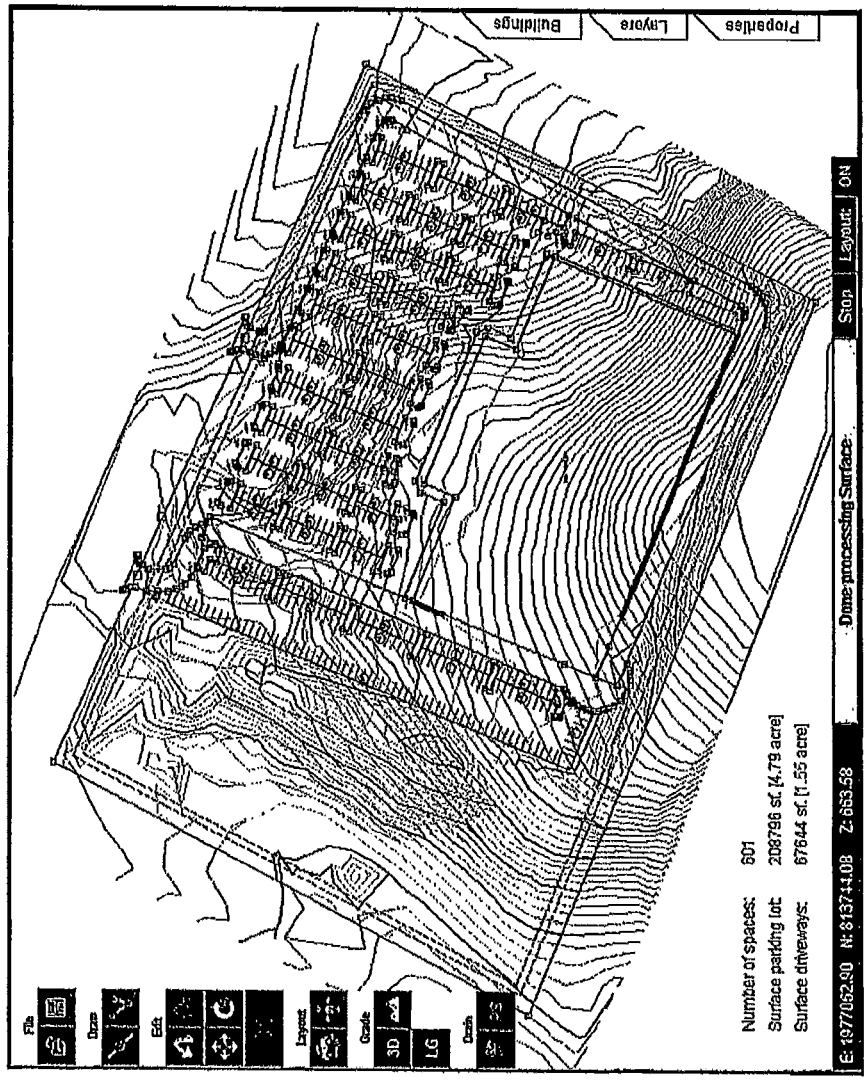
FIG. 43 illustrates an exemplary site laid out without any utility design provided.
Figure 44:
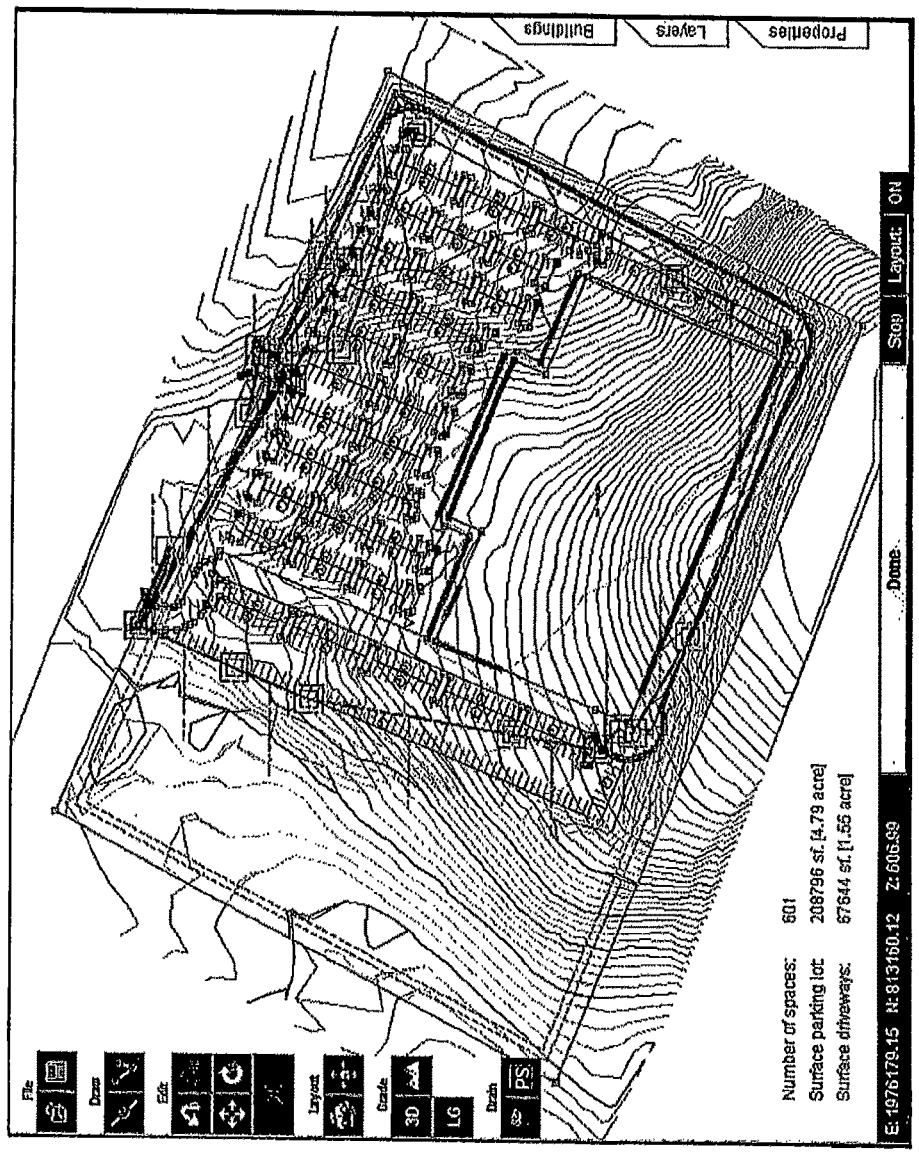
FIG. 44 illustrates an exemplary site after the utility solver has completed the design.
Figure 45:
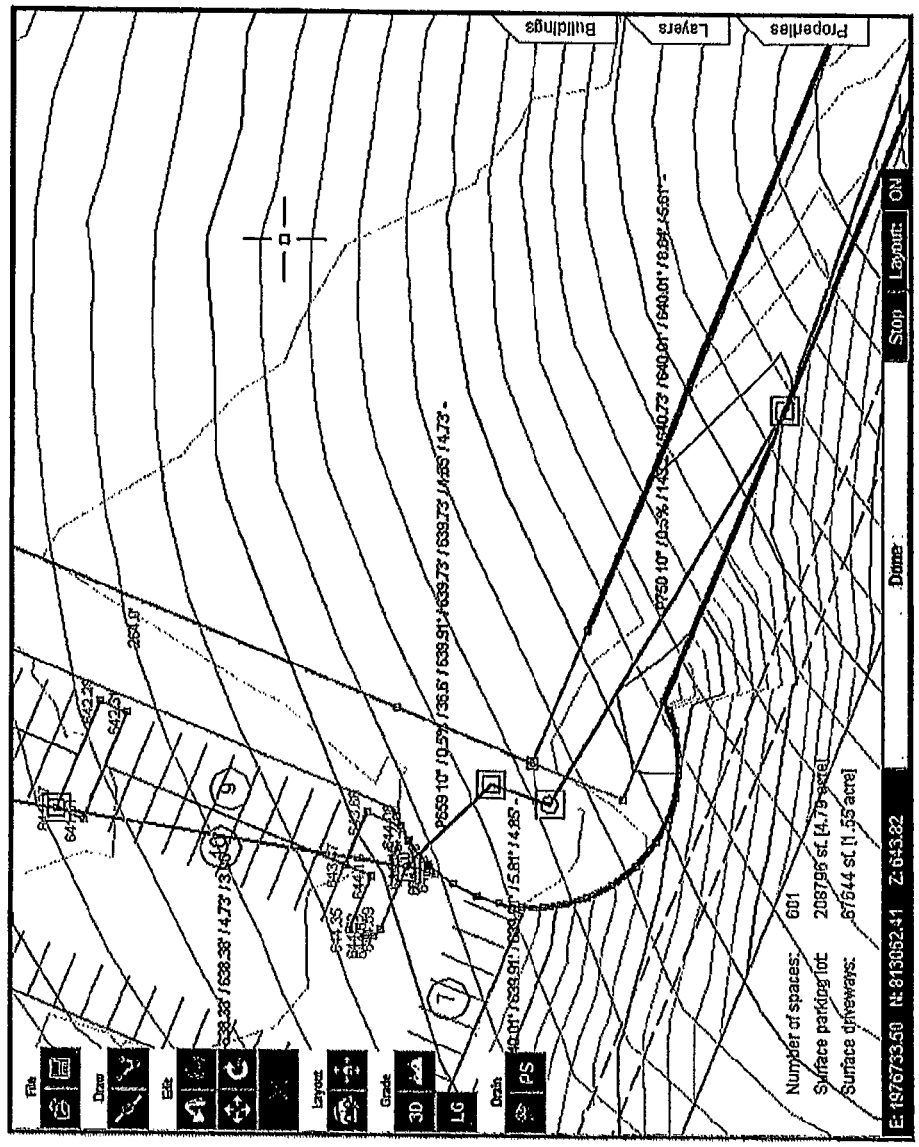
FIG. 45 illustrates an exemplary detailed diagram output to the user.

Input:
A substantially complete layout
A substantially complete three dimensional proposed grade
Utility constraints for the layout
Unit costs for the utility design (pipes/inlets and so on)
Output:
A three dimensional utility plan
A cost report for the utility plan Examples of before and after options from the utility solver are provided in FIGS. 43 and 44, respectively. FIG. 43 shows the site laid out without any utility design provided. FIG. 44 shows what the site looks like after the utility solver has completed the design. FIG. 45 shows details provided in a diagram for the user.

Users can dictate certain utility design features by entering constraints into the system. Some of the constraints that can be created include:
Minimum and Maximum pipe slope
Costs for each Diameter of pipe The utility solver is responsible for all piping issues. There are three main categories for which underground pipes are needed:
(a) Drainage pipes for ground water
(b) Sanitary sewer pipes
(c) Potable water pipes From these three, optimizing a drainage plan is the relatively complicated and also depends largely on the proposed grade of a site. As such, in terms of measuring the quality of a proposed grade, the drainage optimization is an important feasibility test.

(i) Utility (Drainage) Solver

The utility solver can be split, like the other two solvers, into a simulation component and an optimization component. The simulation component can also be split into multiple parts, including: Water Flow calculations and Pipe Throughput calculations. Both are explained in further detail below.

The optimization component in the utility solver consists of optimizing the layout and size of the pipes connecting storm water inlets, ponds and tie-in points. A smaller pipe size or a shorter length means a less costly site, but the piping layout must be able to handle a certain storm on the proposed grade as it is designed by the grading solver. As such, the constraints on this optimization can be rather complicated, but should be accurate in order to prevent flooding on the designed site.

Pipes are also constrained in their elevation. Drainage pipes generally use gravity to move water. Accordingly, a pipe has a minimum slope under which the water will flow. Pipes are not allowed run above ground, and have a maximum depth under which they can be damaged or crushed. Additionally, pipes are not allowed to pass under certain areas like buildings, and are only rarely allowed to pass outside the property boundary. All these (and other) constraints make this a heavily 'bounded' optimization and make it difficult for an evolutionary algorithm to find an effective 'optimization path'.

A typical site may have roughly 20 inlets/tie-in points dispersed over the entire site. This means that the number of possible pipes between two inlets is 20×(20−1)/2, or 190. The number of possible combinations of these pipes to form different layouts is $2^{190}$ which is about $1,6·10^{57}$ (a 1 followed by a 6 and 56 zeros). As such, it is impractical to go through every different piping layout. Optimization in this case without any assumptions would be difficult.

There are two assumptions that make this problem easier:
The cost of a pipe is never negative.
The best piping layout for a subset of the inlets will be part of the best piping layout of the entire site.

The first assumption is important for the second assumption to be true. While civil engineers commonly use the second assumption, in theory there are cases where this assumption does not have to be the case. This along with other constraints, such as 'pipes need to be going somewhere', convert this problem into a local optimization. The System knows where the water needs to go (i.e., to the ponds/tie-in), so that limits the initial number of possibilities, or candidate solutions, to the problem. And, because the solver can assume that any pipe that is good in the beginning is good in the end, the optimization becomes a matter of adding the 'best', feasible pipe to the pipes already-added, over and over until all the inlets are connected.

Figure 46:
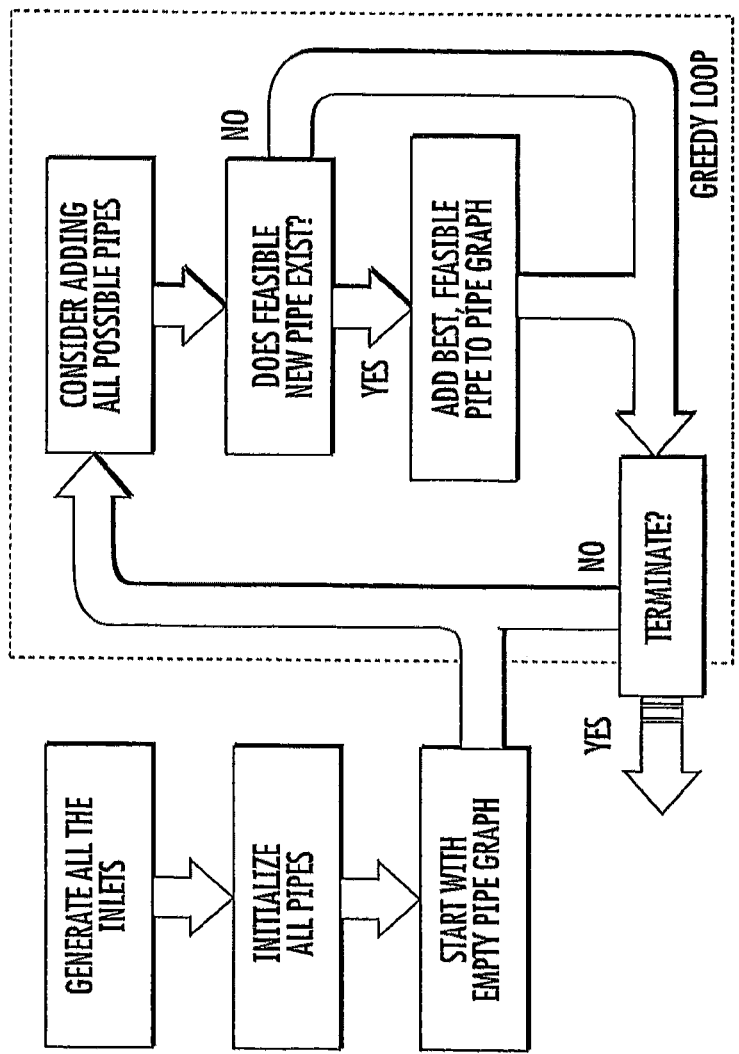
FIG. 46 illustrates an exemplary optimization loop used to generate a drainage plan for the site.

FIG. 46 shows the optimization loop used to generate the drainage plan of the site. Note that there are some similarities with an evolutionary loop. One difference is that with every iteration of this loop, the remaining problem decreases, because every inlet that is connected to the Pipe Graph never has to be considered again.

Generating the inlet locations can be complex. This involves simulating the water flows, and then pinpointing where the water ponds on the pavement surface. The System then checks if an inlet is capable of effectively managing/draining that water. If not, the System adds inlets at strategic locations to catch the water before it ponds. This simulation is done using a flow graph.

The following describes how to 'consider adding a pipe'. Adding a pipe not only impacts the inlets and the pipe itself, but also the pipes the added water flows through to get to the pond/tie-in. This means that every pipe is checked by adding it temporarily to the Pipe Graph and then recalculating the feasibility, sizes, and costs of all the pipes. A pipe is only added if nothing in the Pipe Graph becomes infeasible because of it, and it is the least costly pipe to add; the concept being that adding the least costly pipe over and over again, gives the least costly Pipe Graph at the end. The loop terminates when all the inlets are connected.

(ii) Sewer and Water Optimization

Every building generally has one connection for the sewer and one connection for potable water. These connections are usually piped to the tie-in points in straight lines. The optimization seeks to find the least costly, feasible tie-in point for each of the pipes. Gravity only plays a role for sanitary sewer, because potable water uses a pressurized pipe.

Because sanitary sewer uses gravity, the elevation of the building can have an impact on the feasibility of the sewer pipe. This is considered in the grading solver though. A building is not allowed to go under a certain elevation calculated using the sanitary sewer tie-ins, the connection on the building and, their relative locations.

The utility solver can be divided into three sections:

(a) Storm water sewer (b) Sanitary sewer (c) Potable water

The present implementation of the System will handle the following utility issues:

Flow of water

Location of drainage areas

Location of inlets

Optimization of pipes

Some sanitary sewer and potable water constraints

The utility solver must simulate the flow of water in order to find where the lowest points in the grade are, and how much water drains into these lowest points. In one implementation, cellular automata is used to simulate the flow of water in the form of a grid. A second algorithm uses a 'flow graph' to simulate a more absolute way of direction. The first algorithm may be used as a visual tool, and as a means for flood prediction. The second algorithm is applicable in calculating the location of the inlets and size of the drainage areas.

(i) Cellular Automata

A two dimensional cellular automata is used to simulate the flow of water. Such a cellular automata works by defining a cell to be a small (in this case) rectangular piece of the entire area that has a certain small part of the solution in the form of values. In this case, every cell has the total water that is currently present in the cell. The idea then is to define rules on how the solution (in this case the water) interacts with the neighboring cells. In synchronized cellular automata, this is done by recalculating the values in the cells every iteration using the values of the neighboring cells in the previous iteration with a system of rules. These rules, together with the topology of the CA, then define the behavior of the CA.

The neighborhood of a cell can be defined in different ways, such as the 'von Neumann' neighborhood. In this neighborhood, two cells are neighbors if and only if they are directly connecting horizontally or vertically. That means that every cell has only four neighbors.

The rule system to simulate water flow in this CA is based on the slope of the triangle that the cell overlaps. Every cell is assigned to the triangle exactly under the center of the cell. The slope of that triangle will then dictate the flow of all the water in the cell. This makes this algorithm an estimation, and with a too small cell size it might be inaccurate. The cells can be resized to any size though, and the level of accuracy is bound to exceed the level of accuracy of the data in the surface itself.

The standard update loop resembles:

```
For all cells do:
    Water in cell = 1.0
While still changes:
    For all cells do:
        Flow to cell = 0
    For all cells do:
        x = slope in x direction
        y = slope in y direction
        len = length of slope vector
        if x > 0 do:
            flow to neighbor right += water * x / len
        else do:
            flow to neighbor left += water * -x / len
        if y > 0 do:
            flow to neighbor up += water * x / len
        else do:
            flow to neighbor down += water * -x / len
    For all cells do:
        Water in cell = flow to cell
```

(ii) Flow Graph

A flow graph algorithm attempts to capture the total flow of the surface in one graph structure. Once that graph is generated, basic functions like flow to inlet, delineation of drainage areas and size of drainage areas can be easily calculated.

A flow graph is generated using 'nodes'. Every triangle in the surface gets one of these nodes. Every triangle in the data structure is already aware of its neighboring triangle and even its neighboring triangle in a neighboring area (or 'linked triangle'). Nodes can be connected to other nodes if the water of a triangle drains into a neighboring triangle. Every such connection is called a 'flow', and all connections have a certain 'percentage' of the total flow of the triangle assigned to it. The percentage of the total flow is calculated according to the percentage of the triangle that flows off the edge to the neighboring triangle according to the slope.

Drainage is calculated on finished grade, thus requiring consideration for curbs. Curbs stop the flow of water in one direction, but allow flow in other directions. As such, the water can flow from a sidewalk into the parking lot for instance, but not into the other way. The data structure defines area borders in such a way that every triangle is only on one side of a border, so no border is going through a triangle. Also, the neighbor of a triangle on the other side of a border is linked differently to neighboring triangles on the same side of the border.

The type of area defines whether or not a curb is used to border the area. In general, curbs are only used where paved areas meet non-paved areas. Every area has a 'needsPaving' flag that is used to determine this. For the flow graph, it means that no flow is allowed to go from paved areas to non paved areas. Flows in other directions are allowed. Any border that is not allowed to let water through is handled as if it was a channel. That means that water will flow to the lowest end of the edge that blocks the water and a helper-node will be created.

Retaining walls are also a flow stopper. Water is not allowed to flow from a lower area onto a higher area. This is handled in a similar way to curbs. Yet, if flow over a retaining wall is allowed (from higher to lower) a flow if generated from the high point to the low point. This precedes any other flow from the high point into triangles of channels.

(iii) Drainage Areas

A drainage area is the total area of the surface that drains to a certain local lowest point. The local lowest points can be found pretty easily by searching all the nodes for nodes that do not have any outgoing flow. In theory every local lowest node has a drainage area.

To calculate the size of a drainage area the algorithm starts at a local lowest point and recursively walks 'up the flow' and adds the relative size of the flow to the amount of water which is identical to the size of the drainage area. This resembles the following: Function to calculate size of flow into a node:

```
If size already calculated
    Return size
size = 0
If node has triangle do:
    size += size of triangle
For all nodes flowing into this node do:
    nsize = calculate size of flow into source node
    size += percentage of flow * nsize
Return size
```

Because every triangle has an area and every area has a runoff coefficient, the runoff coefficient of a drainage area can be calculated with a similar recursive approach.

The delineation of the drainage areas is done by drawing lines between triangles for which the majority of the flow goes to different inlets. While this is an estimation on top of an estimation, it is primarily used for visualization purposes and is therefore sufficiently accurate.

(iv) Inlets

The standard inlets are placed at the local lowest points of the drainage areas. But not all inlets need to be piped. All inlets that drain water that would otherwise stand in impervious areas need to be piped. Impervious area is all the area that is paved plus all the area that is build upon. All local lowest points outside the impervious area do not need to be drained and should actually drain in a similar way as before the site was graded.

Out parcels are exceptions to this rule. Out parcels are graded to anticipate a building and a parking lot, but they are not paved yet. Most out parcels need to be drained though.

Some drainage areas are too large for only one inlet. If a drainage area exceeds the maximum size for an inlet, more inlets need to be added to the drainage area. An extra inlet is added by walking the flow graph from the existing inlet upwards until the flow to the current position is smaller then the maximum inlet size. That process resembles:

```
While inlet is too big do:
    Current = inlet
    While flow at current is to big:
        Walk upwards to node with biggest flow
    Add inlet at current
    Recalculate flow to inlet
```

This algorithm does assume that there is no triangle that is bigger than the maximum size of an inlet, but this can be assured by dividing triangles that are to be during triangulation.

(v) Pipes

The process of generating pipes uses a greedy algorithm. To generate the pipe graph, the algorithm uses all the inlets generated earlier plus all the tie-in points. A tie-in point can be either a point on an existing pipe line or a pond. The algorithm then generated all possible pipes between the inlets themselves and the tie-in points. A pipe from an inlet to a pond ends in the closest point on the surface boundary of pond. Some pipes are of course illegal. For instance, pipes that go through a building are illegal. Those pipes are routed around the building in the shortest way possible. This also goes for the pipes that go through the property boundary.

```
For every combination of inlets do:
    Generate pipe
    For all obstacles do:
        Route pipe around obstacle
For all tie-in points do:
    For all inlets do:
        Generate pipe
        For all obstacles do:
            Route pipe around obstacle
```

After this preprocessing, there exists a list of all the legal pipe paths from every inlet to every other inlet and from every inlet to every tie-in point.

To generate the pipe graph from the list of all the possible pipes, the greedy algorithm adds 'the best' pipe to an already existing graph. The best pipe is here defined by the smallest cost of the entire pipe graph. That means that every time a pipe is 'tried' the cost of the entire pipe graph needs to be calculated. Water needs to flow through the pipe using gravity. That means that water that flows into an inlet at a certain elevation can not flow out of that inlet at a higher elevation. This plus the fact that every pipe needs to be between a certain minimum and maximum slope means that certain elevations can change if one pipe is added.

The pipes also need to be 'sized'. That means that the amount of water that flows through the pipe per second will dictate the minimum size that is needed to make the flow feasible. This is done using the Manning's equation. This equation estimates the flow through the pipe using the size of the drainage areas draining into it, the time it takes to get the water to the pipe and things like slope and material that is used in the pipe itself. There is a standard set of pipe sized and materials that are used, and the algorithm selects the one most cost effective for the current pipe graph. The algorithm to generate the pipe graph resembles the following:

```
Graph = set of tie-in points
While not all inlets are done do:
    For all pipes next to current graph do:
        Connect pipe to graph
        Recalculate the cost of graph
        Disconnect pipe
    Connect the cheapest pipe to graph
```

V. Cost Model

The following discussion outlines calculations for simulations and cost models in the optimization engine. In the present exemplary implementation, the cost model is the heart of the optimization process. Everything is optimized according to cost.

The cost model has two types of input:

Unit costs, being the cost for all parts of the site.

Amounts, being the size/weight/length of all parts of the site.

(i) Unit Costs

The unit costs used are the following:

Grading Solver:

| | |
|---|---|
| Cclearing | cost per acre of clearing the site |
| Cstripping | cost per acre of stripping the site |
| Cearth | cost to cut a cubic yard of earth on site |
| Crock | cost to cut a cubic yard of rock on site |

| | |
|---|---|
| Cunsuitable | cost to cut a cubic yard of unsuitable |
| Cfill | cost to fill a cubic yard |
| Cborrow | cost to borrow a cubic yard from off site |
| Cwaste | cost to export a cubic yard from site |
| CretainingWall | cost to build one square feet of retaining wall |
| Cfinish | cost to finish one acre of graded site |
| Cseeding | cost to seed one acre |
| Cerosion | cost to counter erosion on one acre |
| Cpaving | cost to pave one square yard |
| Csidewalk | cost to put sidewalk concrete on one sq. yard |
| Ccurb | cost to build one feet of curb |
| Utility Solver: | |
| CinletEA | cost for one inlet |
| CinletFT | cost for one feet of inlet |
| CinletOversizedEA | cost for one oversized inlet |
| CinletOversizedFT | cost for one feet of oversized inlet |
| CmanholeEA | cost for one manhole |
| CmanholeFT | cost for one feet of manhole |
| CmanholeOversizedEA | cost for an oversized manhole |
| CmanholeOversizedFT | cost for one feet of oversized manhole |
| Cpump | cost for one pump |
| Criprap | cost for one placement of riprap |
| Cpondkit | cost for one pondkit |
| Cstormmain | cost for one tie in to a storm main |
| CpipeRock | cost for piping though one cubic yard of rock |
| Cfes | a list of costs of each different size of FES |
| Crcp | a list of costs for each different size of RCP pipe |

(ii) Measurements

With all these costs go a list of measurements that are needed to calculate the total cost of a site. The following discussion will outline how the cut and fill is calculated.

The list of all the measurements used in the cost model:

| Grading Solver: | |
|---|---|
| VdisturbedArea | the total area that is disturbed by the grading |
| Vtopsoil | the total amount of topsoil that was stripped |
| VearthCut | the total amount of earth cut during grading |
| VrockCut | the total amount of rock cut during grading |
| VunsuitableCut | the total amount of unsuitable cut |
| Vfill | the total amount filled during grading |
| Vwaste | the total amount exported from site |
| Vborrow | the total amount imported to site |
| VwallSurface | the total wall surface |
| Vpaving | the total paving surface |
| Vcurb | the total curb length |
| Vsidewalk | the total sidewalk surface |
| Utility Solver: | |
| VinletsEA | the total number of inlets |
| VinletsFT | the total combined height of the inlets |
| VinletsOversizedEA | the total number of oversized inlets |
| VinletsOversizedFT | the total combined height of the oversized inlets |
| VmanholesEA | the total number of manholes |
| VmanholesFT | the total combined height of the manholes |
| VmanholesOversizedEA | the total number of oversized manholes |
| VmanholesOversizedFT | the total combined height of the manholes |
| Vripraps | the number of ripraps |
| Vpondkits | the number of pond kits |
| Vstormmains | the number of storm water main tie-ins |
| Vpumps | the number of pumps |
| VpipeRockCut | the total amount of rock cut for pipes |
| Vfes | a list of amounts per size of FES |
| Vrcp | a list of lengths per size of RCP pipe |

The cost model is recalculated primarily during the grading and drainage solver. The layout solver concentrates more on the number of parking spaces and the size of the paving area. The paving area does however have a direct relation with the cost of the paving area, and therefore the cost of the layout. However, because this is only one aspect of this complex cost report, the entire cost report does not need to be recalculated during the layout solver.

The entire cost model is recalculated in the following way:

```
// calculate all the grading costs
calculateClearing(VdisturbedArea, Vtopsoil);
calculateCutAndFill(VearthCut, VrockCut, VunsuitableCut, Vfill);
calculateWalls(VretainingWall);
calculateFinish(VdisturbedArea, Vpaving, Vcurb, Vsidewalk);
calculateErosionControl(VdisturbedArea);
// calculate all the utility costs
    calculateSWSInlets(VinletsEA, VinletsOversizedEA,
            VinletsFT, VinletsOversizedFT);
    calculateSWSManholes(VmanholesEA, VmanholesOversizedEA,
            VmanholesFT, VmanholesOversizedFT);
    calculateSWSRest(Vriprap, Vpumps, Vpondkits, Vstormmains);
```

Note that the only costs that are affecting the layout solver are calculated during the 'calculateFinish' function.

The different grading costs are calculated in the following way:

calculateClearing(VdisturbedArea, Vtopsoil):

$$\text{cost} \mathrel{+}= V\text{disturbedArea} * C\text{clearing};$$

$$\text{cost} \mathrel{+}= V\text{disturbedArea} * V\text{topsoil} * C\text{stripping};$$

calculateCutAndFill(VearthCut, VrockCut, VunsuitableCut, Vfill):

$$V\text{onsite} = \min(V\text{earthCut}, V\text{fill});$$

$$V\text{waste} = (V\text{earthCut} - V\text{fill}) * F\text{expansion};$$

$$V\text{borrow} = (V\text{fill} - V\text{earthCut}) / F\text{compaction};$$

if $(V\text{waste} < 0) V\text{waste} = 0;$ if $(V\text{borrow} < 0) V\text{borrow} = 0;$ $$\text{cost} \mathrel{+}= V\text{onsite} * C\text{earth} + V\text{rockCut} * C\text{rock} + V\text{unsuitable} * C\text{unsuitable};$$

$$\text{cost} \mathrel{+}= V\text{onsite} * C\text{fill};$$

$$\text{cost} \mathrel{+}= V\text{borrow} * C\text{borrow};$$

$$\text{cost} \mathrel{+}= V\text{waste} * C\text{waste};$$

calculateWalls(VretainingWall):

$$\text{cost} \mathrel{+}= V\text{retainingWall} * C\text{retainingWall};$$

calculateFinish(VdisturbedArea, Vpaving, Vcurb, Vsidewalk):

$$\text{cost} \mathrel{+}= V\text{finish} * C\text{disturbedArea};$$

$$\text{cost} \mathrel{+}= V\text{paving} * C\text{paving};$$

$$\text{cost} \mathrel{+}= V\text{curb} * C\text{curb};$$

$$\text{cost} \mathrel{+}= V\text{sideWalk} * C\text{sidewalk};$$

calculateErosionControl(VdisturbedArea):

$$\text{cost} \mathrel{+}= V\text{erosion} * C\text{erosion};$$

And the same can be done for all the utility related functions:
calculateSWSInlets(VinletsEA, VinletsOversizedEA, VinletsFT, VinletsOversizedFT):

$$\text{cost} \mathrel{+}= V\text{inlets}EA * C\text{inlets}EA;$$

$$\text{cost} \mathrel{+}= V\text{inletsOversized}EA * C\text{inletsOversized}EA;$$

cost+=VinletsFT*CinletsFT;

cost+=VinletsOversizedFT*CinletsOversizedFT;

calculateSWSManholes(VmanholesEA, VmanholesOversizedEA, VmanholesFT, VmanholesOversizedFT):

cost+=VmanholesEA*CmanholesEA;

cost+=VmanholesOversizedEA*CmanholesOversizedEA;

cost+=VmanholesFT*CmanholesFT;

cost+=VmanholesOversizedFT*CmanholesOversizedFT;

calculateSWSFES(Vfes):
for every different size of FES do:

CthisFES=cost in Cfes with current size;

VthisFES=number of FES's used with this size;

cost+=CthisFES*VthisFES;

calculateSWSRCP(Vrcp):
for every different size of RCP do:

CthisRCP=cost in Crcp with current size;

VthisRCP=total size RCP pipe used with this size;

cost+=CthisRCP*VthisRCP;

calculateSWSRest(Vriprap, Vpumps, Vpondkits, Vstormmains):

cost+=Vriprap*Criprap;

cost+=Vpumps*Cpumps;

cost+=Vpondkits*Cpondkits;

cost+=Vstormmains*Cstormmains;

This above describes the total cost of a site as calculated by the optimization engine. In order to optimize for this cost, the solvers use an evolutionary approach to incrementally decrease this cost by changing the different input parameters.

VI. Exemplary Cost Report

One example of a Cost Report generated using the present System and Method is attached at FIGS. 47A and 47B.

For the purposes of describing and defining the present invention it is noted that the use of relative terms, such as "substantially", "generally", "approximately", and the like, are utilized herein to represent an inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Exemplary embodiments of the present invention are described above. No element, act, or instruction used in this description should be construed as important, necessary, critical, or essential to the invention unless explicitly described as such. Although only a few of the exemplary embodiments have been described in detail herein, those skilled in the art will readily appreciate that many modifications are possible in these exemplary embodiments without materially departing from the novel teachings and advantages of this invention. Accordingly, all such modifications are intended to be included within the scope of this invention as defined in the appended claims.

In the claims, any means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. Unless the exact language "means for" (performing a particular function or step) is recited in the claims, a construction under § 112, 6th paragraph is not intended. Additionally, it is not intended that the scope of patent protection afforded the present invention be defined by reading into any claim a limitation found herein that does not explicitly appear in the claim itself.

We claim:

1. A computer-implemented land planning system designed to generate at least one conceptual fit and optimized solution to a user-defined land development problem, the solution comprising a conceptual site layout including at least one building pad and a vehicle parking area within an undeveloped land site, said system comprising:

a processor configured to conceptually designing said vehicle parking area within the undeveloped land site, said vehicle parking area comprising a plurality of user defined constraints selected from a group consisting of a predetermined minimum size of said parking area, a predetermined minimum number of parking spaces within said parking area, a width of each parking space, a depth of each parking space, custom-sized parking spaces, aisle width, number of handicap parking spaces, and number of divided parking lots within said parking area;

said processor further configured to electronically generating at least one candidate solution to the land development problem given the user defined constraints of said vehicle parking area, said candidate solution comprising a plurality of interrelated engineering measurements applicable in development of the undeveloped land site, and said engineering measurements comprising site layout measurements selected from a group consisting of building pad location within said undeveloped land site, building pad orientation relative to said vehicle parking area, a paving surface measurement, curb length, and a sidewalk surface measurement;

an optimization engine comprising a heuristic problem-solving strategy utilizing nonlinear processes to manipulate said engineering measurements of said candidate solution given the user defined constraints of said vehicle parking area until at least one optimized fit solution to the land development problem is achieved, whereby a change relative to one of said plurality of engineering measurements for said candidate solution effects a change relative to another of said plurality of engineering measurements for that candidate solution; and an output device configured to output to a user documentation illustrating said optimized fit solution to the land development problem, wherein the optimized fit solution comprises a site plan applicable for use in development of the land site.

2. The computer-implemented land planning system according to claim 1, and comprising means for incorporating one or more custom islands within said parking area.

3. The computer-implemented land planning system according to claim 1, and comprising means for illustrating one or more transition pathways within said parking area.

4. The computer-implemented land planning system according to claim 1, and comprising means for creating parking spaces on arcs within said parking area.

5. The computer-implemented land planning system according to claim 1, wherein said plurality of engineering measurements are further selected from a group consisting of site grading and site utilities.

6. The computer-implemented land planning system according to claim 5, wherein said plurality of engineering measurements for site grading are selected from a group consisting of a measurement of disturbed area, a measurement of stripped topsoil, a measurement of earth cut, a measurement of rock cut, a measurement of unsuitable cut, a measurement of fill, a measurement of cut exported from site, a measurement of fill imported to site, and a wall surface measurement.

7. The computer-implemented land planning system according to claim 5, wherein said plurality of engineering measurements for site utilities are selected from a group consisting of number of inlets, height of inlets, number of manholes, height of manholes, number of ripraps, number of pond kits, number of storm water main tie-ins, number of pumps, and amount of rock cut for pipes.

8. A computer-implemented land planning method designed to generate at least one conceptual fit and optimized solution to a user-defined land development problem, the solution comprising a conceptual site layout including at least one building pad and a vehicle parking area within an undeveloped land site, said method comprising:
    using the computing device, conceptually designing said vehicle parking area within the undeveloped land site, said vehicle parking area comprising a plurality of user defined constraints selected from a group consisting of a predetermined minimum size of said parking area, a predetermined minimum number of parking spaces within said parking area, a width of each parking space, a depth of each parking space, custom-sized parking spaces, aisle width, number of handicap parking spaces, and number of divided parking lots within said parking area;
    using the computing device, electronically generating at least one candidate solution to the land development problem given the user defined constraints of said vehicle parking area, said candidate solution comprising a plurality of interrelated engineering measurements applicable in development of the undeveloped land site, and said engineering measurements comprising site layout measurements selected from a group consisting of building pad location within said undeveloped land site, building pad orientation relative to said vehicle parking area, a paving surface measurement, curb length, and a sidewalk surface measurement;
    using the computing device, employing an optimization engine comprising a heuristic problem-solving strategy utilizing nonlinear processes to manipulate the engineering measurements of the candidate solution given the user defined constraints of said vehicle parking area until at least one optimized fit solution to the land development problem is achieved, whereby a change relative to one of the plurality of engineering measurements for the candidate solution effects a change relative to another of the plurality of engineering measurements for that candidate solution; and
    using an output device, outputting to a user documentation illustrating the optimized fit solution to the land development problem, wherein the documentation comprises a site plan applicable for use in development of the land site.

9. The computer-implemented land planning method according to claim 8, wherein conceptually designing a vehicle parking area comprises incorporating one or more custom islands within the parking area.

10. The computer-implemented land planning method according to claim 8, wherein conceptually designing a vehicle parking area comprises illustrating one or more transition pathways within the parking area.

11. The computer-implemented land planning method according to claim 8, wherein conceptually designing a vehicle parking area comprises creating parking spaces on arcs within the parking area.

12. A computer-readable non-transitory storage medium storing computer-executable instructions, that when executed by processing logic of a computing device, cause the processing logic to perform a land planning method designed to generate at least one conceptual fit and optimized solution to a user-defined land development problem, the solution comprising a conceptual site layout including at least one building pad and a vehicle parking area within an undeveloped land site, said method comprising:
    using the computing device, conceptually designing said vehicle parking area within the undeveloped land site, said vehicle parking area comprising a plurality of user defined constraints selected from a group consisting of a predetermined minimum size of said parking area, a predetermined minimum number of parking spaces within said parking area, a width of each parking space, a depth of each parking space, custom-sized parking spaces, aisle width, number of handicap parking spaces, and number of divided parking lots within said parking area;
    using the computing device, electronically generating at least one candidate solution to the land development problem given the user defined constraints of said vehicle parking area, said candidate solution comprising a plurality of interrelated engineering measurements applicable in development of the undeveloped land site, and said engineering measurements comprising site layout measurements selected from a group consisting of building pad location within said undeveloped land site, building pad orientation relative to said vehicle parking area, a paving surface measurement, curb length, and a sidewalk surface measurement;
    using the computing device, employing an optimization engine comprising a heuristic problem-solving strategy utilizing nonlinear processes for manipulating the engineering measurements of the candidate solution given the user defined constraints of said vehicle parking area until at least one optimized fit solution to the land development problem is achieved, whereby a change relative to one of the plurality of engineering measurements for the candidate solution effects a change relative to another of the plurality of engineering measurements for that candidate solution; and
    using an output device, outputting to a user documentation illustrating the optimized fit solution to the land development problem, wherein the documentation comprises a site plan applicable for use in development of the land site.

* * * * *